(12) United States Patent
Graham et al.

(10) Patent No.: US 10,693,277 B2
(45) Date of Patent: *Jun. 23, 2020

(54) IMPLANT REGROWTH VCSEL AND VCSEL ARRAY WITH HETEROGENEOUS COMBINATION OF DIFFERENT VCSEL TYPES

(71) Applicant: Finisar Corporation, Sunnyvale, CA (US)

(72) Inventors: Luke A. Graham, Allen, TX (US); Sonia Quadery, Allen, TX (US); Deepa Gazula, Allen, TX (US); Haiquan Yang, Mckinney, TX (US)

(73) Assignee: II-VI Delaware Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/533,734

(22) Filed: Aug. 6, 2019

(65) Prior Publication Data
US 2019/0393678 A1 Dec. 26, 2019

Related U.S. Application Data

(63) Continuation of application No. 15/718,342, filed on Sep. 28, 2017, now Pat. No. 10,374,391.
(Continued)

(51) Int. Cl.
*H01S 5/183* (2006.01)
*H01S 5/42* (2006.01)
*H01S 5/20* (2006.01)

(52) U.S. Cl.
CPC .......... *H01S 5/183* (2013.01); *H01S 5/18308* (2013.01); *H01S 5/18338* (2013.01);
(Continued)

(58) Field of Classification Search
CPC .. H01S 5/18338; H01S 5/18361; H01S 5/423; H01S 5/2063; H01S 5/183
See application file for complete search history.

(56) References Cited

U.S. PATENT DOCUMENTS

| | | | | |
|---|---|---|---|---|
| 5,764,674 A | * | 6/1998 | Hibbs-Brenner | B82Y 20/00 372/46.01 |
| 6,515,305 B2 | * | 2/2003 | Gopinath | H01S 5/18327 257/79 |

(Continued)

*Primary Examiner* — Tuan N Nguyen
(74) *Attorney, Agent, or Firm* — Maschoff Brennan

(57) ABSTRACT

A non-planarized VCSEL can include: a blocking region over or under an active region, the blocking region having a first thickness; one or more conductive channel cores in the blocking region, the one or more conductive channel cores having a second thickness that is larger than the first thickness, wherein the blocking region is defined by having an implant and the one or more conductive channel cores are devoid of the implant, wherein the blocking region is lateral the one or more conductive channel cores, the blocking region and one or more conductive channel cores being an isolation region; and a non-planarized semiconductor region of one or more non-planarized semiconductor layers over the isolation region. The VCSEL can include a planarized bottom mirror region below the active region and a non-planarized top mirror region above the isolation region, or a non-planarized bottom mirror region below the active region.

20 Claims, 13 Drawing Sheets

Related U.S. Application Data

(60) Provisional application No. 62/559,364, filed on Sep. 15, 2017, provisional application No. 62/401,051, filed on Sep. 28, 2016.

(52) U.S. Cl.
CPC ........ *H01S 5/18361* (2013.01); *H01S 5/2059* (2013.01); *H01S 5/2063* (2013.01); *H01S 5/423* (2013.01); *H01S 5/18311* (2013.01); *H01S 5/209* (2013.01)

(56) References Cited

U.S. PATENT DOCUMENTS

| | | | |
|---|---|---|---|
| 2002/0163947 A1* | 11/2002 | Ostergaard | H01S 5/18355 372/43.01 |
| 2005/0063440 A1 | 3/2005 | Deppe | |
| 2005/0249254 A1* | 11/2005 | Deppe | H01S 5/18327 372/46.01 |
| 2007/0013996 A1* | 1/2007 | Verma | B82Y 10/00 359/344 |
| 2016/0072258 A1 | 3/2016 | Seurin et al. | |

* cited by examiner

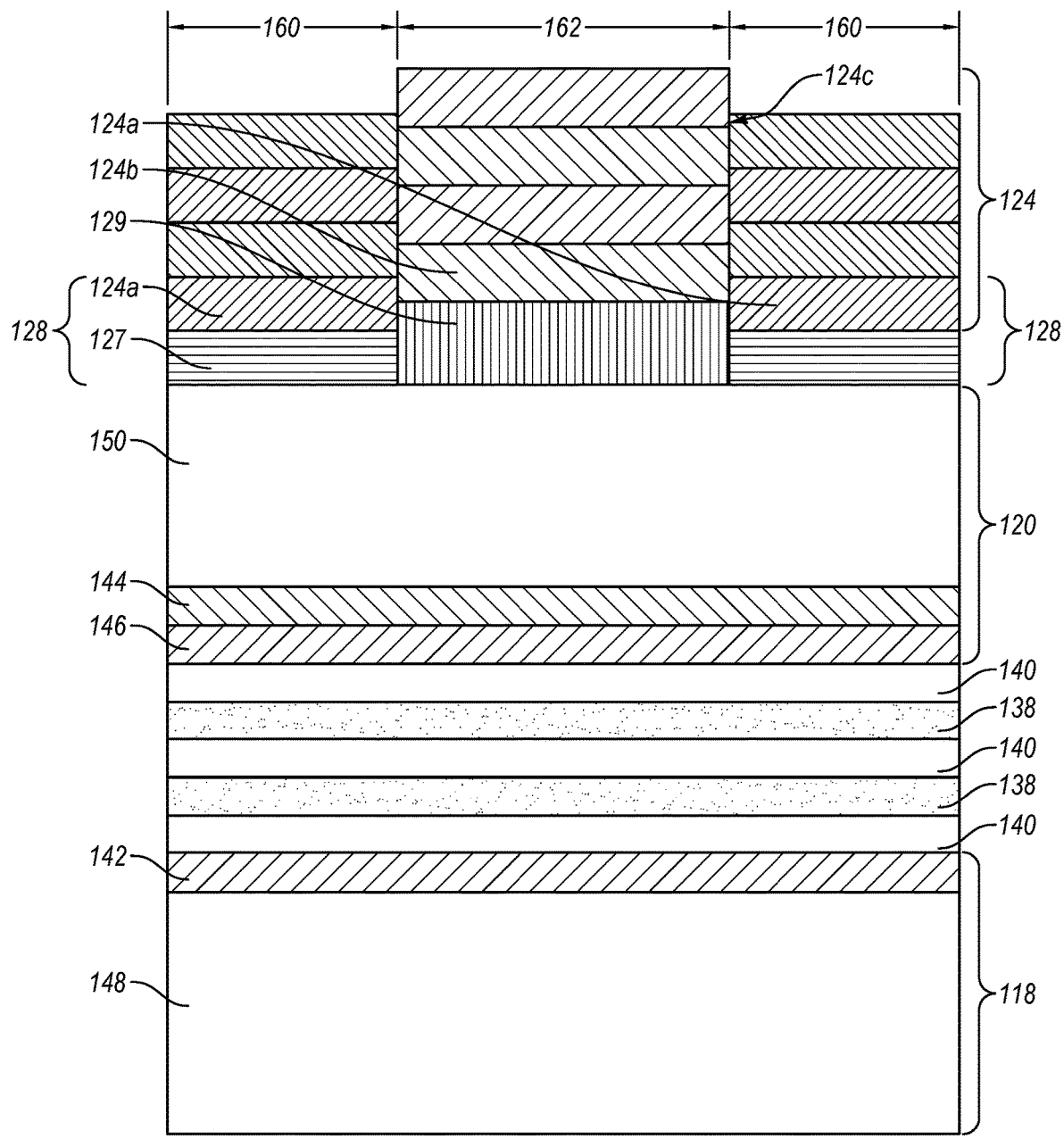
FIG. 2
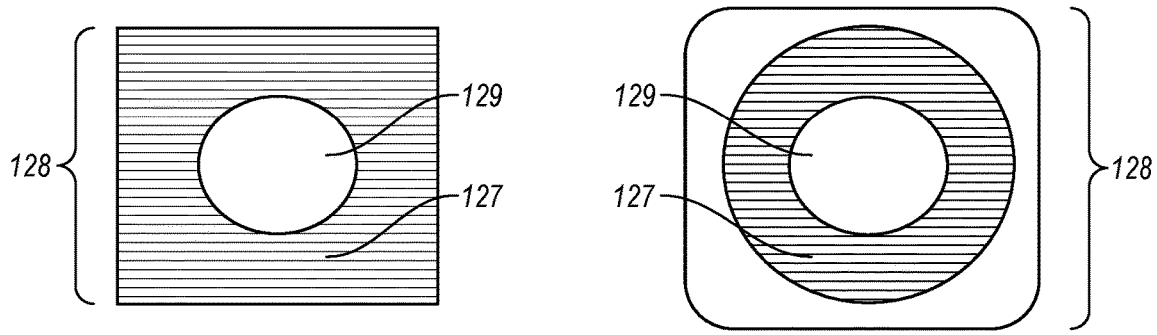
FIG. 2A  FIG. 2B

IMPLANT REGROWTH VCSEL AND VCSEL ARRAY WITH HETEROGENEOUS COMBINATION OF DIFFERENT VCSEL TYPES

CROSS-REFERENCE

This patent application is a Continuation of U.S. patent application Ser. No. 15/718,342, filed Sep. 28, 2017, which claims priority to U.S. Provisional Application No. 62/401,051 filed Sep. 28, 2016, and claims priority to U.S. Provisional Application No. 62/559,364 filed Sep. 15, 2017, all of which are incorporated herein by specific reference in their entirety.

BACKGROUND

Lasers are commonly used in many modern communication components for data transmission. One use that has become more common is the use of lasers in data networks. Lasers are used in many fiber optic communication systems to transmit digital data on a network. In one exemplary configuration, a laser may be modulated by digital data to produce an optical signal, including periods of light and dark output that represents a binary data stream. In actual practice, the lasers output a high optical output representing binary highs and a lower power optical output representing binary lows. To obtain quick reaction time, the laser is constantly on, but varies from a high optical output to a lower optical output.

Optical networks have various advantages over other types of networks such as copper wire based networks. For example, many existing copper wire networks operate at near maximum possible data transmission rates and at near maximum possible distances for copper wire technology. On the other hand, many existing optical networks exceed, both in data transmission rate and distance, the maximums that are possible for copper wire networks. That is, optical networks are able to reliably transmit data at higher rates over further distances than is possible with copper wire networks.

One type of laser that is used in optical data transmission is a Vertical Cavity Surface Emitting Laser (VCSEL). As its name implies, a VCSEL has a laser cavity that is sandwiched between and defined by two mirror stacks. A VCSEL is typically constructed on a semiconductor wafer such as Gallium Arsenide (GaAs). The VCSEL includes a bottom mirror constructed on the semiconductor wafer. Typically, the bottom mirror includes a number of alternating high and low index of refraction layers. As light passes from a layer of one index of refraction to another, a portion of the light is reflected. By using a sufficient number of alternating layers, a high percentage of light can be reflected by the mirror.

An active region that includes a number of quantum wells is formed on the bottom mirror. The active region forms a PN junction sandwiched between the bottom mirror and a top mirror, which are of opposite conductivity type (e.g. one p-type mirror and one n-type mirror). Notably, the notion of top and bottom mirrors can be somewhat arbitrary. In some configurations, light could be extracted from the wafer side of the VCSEL, with the "top" mirror totally reflective—and thus opaque. However, for purposes of this invention, the "top" mirror refers to the mirror from which light is to be extracted, regardless of how it is disposed in the physical structure. Carriers in the form of holes and electrons are injected into the quantum wells when the PN junction is forward biased by an electrical current. At a sufficiently high bias current, the injected minority carriers form a population inversion in the quantum wells that produces optical gain. Optical gain occurs when photons in the active region stimulate electrons to recombine with holes in the conduction band to the valance band, which produces additional photons. When the optical gain exceeds the total loss in the two mirrors, laser oscillation occurs.

The active region may also include an oxide aperture formed using one or more oxide layers formed in the top and/or bottom mirrors near the active region. The oxide aperture serves both to form an optical cavity and to direct the bias current through the central region of the cavity that is formed. Alternatively, other means, such as ion implantation, epitaxial regrowth after patterning, or other lithographic patterning may be used to perform these functions.

A top mirror is formed on the active region. The top mirror is similar to the bottom mirror in that it generally comprises a number of layers that alternate between a high index of refraction and a lower index of refraction. Generally, the top mirror has fewer mirror periods of alternating high index and low index of refraction layers, to enhance light emission from the top of the VCSEL.

Illustratively, the laser functions when a current is passed through the PN junction to inject carriers into the active region. Recombination of the injected carriers from the conduction band to the valence band in the quantum wells results in photons that begin to travel in the laser cavity defined by the mirrors. The mirrors reflect the photons back and forth. When the bias current is sufficient to produce a population inversion between the quantum well states at the wavelength supported by the cavity, optical gain is produced in the quantum wells. When the optical gain is equal to the cavity loss, laser oscillation occurs and the laser is said to be at threshold bias and the VCSEL begins to 'lase' as the optically coherent photons are emitted from the top of the VCSEL.

U.S. Pat. No. 8,774,246 describes light emitting devices with a current blocking region formed using a depleted semiconductor heterojunction interface. Using this type of heterojunction interface for blocking allows a conductive channel to be formed by applying location selective specific doping changes either to the blocking region, or to the center conductive region itself. In this approach, doping is delivered via a diffusion mechanism.

Zou et al. (D. Zhou and L. J. Mawst, "High-Power Single-Mode Antiresonant Reflecting Optical Waveguide-Type Vertical-Cavity-Surface-Emitting Lasers," IEEE Journal of Quantum Electronics, 58, no 12, 1599-1606 (2002)) describes light emitting devices that use a heterojunction current blocking region and a center etched conductive channel, but the subsequent regrowth used in this design is not planarizing and does not form an index guiding optical mode in the center channel of the device. Instead, antiresonant devices with larger optical modes that can leak into the adjacent area are formed. While this may be useful for very large emitters or closely placed arrays, the design approach is not desirable for single high optical output efficiency and high modulation bandwidth VCSELs.

In Chriovsky et al. (L. M. F. Chriovsky, W. S. Hobson, R. E. Leibenguth, S. P. Hui, J. Lopata, G. J. Zydzik, G. Giaretta, K. W. Goossen, J. D. Wynn, A. V. Krishnamoorthy, B. J. Tseng, J. M. Vandenberg, L. A. D'Asaro, "Implant-Apertured and Index-Guided Vertical-Cavity-Surface-Emitting Lasers ($I^2$-VCSELs)," IEEE Photonics Technology Letters, 11, no 5, 500-502 (1999)) the current blocking region is formed by ion implantation damage, and not through use of a low doped heterojunction. The index guided optical mode is formed via an etched mesa as in U.S. Pat. No. 8,774,246.

The subject matter claimed herein is not limited to embodiments that solve any disadvantages or that operate only in environments such as those described above. Rather, this background is only provided to illustrate one example technology where some embodiments described herein may be practiced.

SUMMARY

In one embodiment, a non-planarized vertical cavity surface emitting laser (VCSEL) can include: a blocking region over or under an active region, the blocking region having a first thickness; one or more conductive channel cores in the blocking region, the one or more conductive channel cores having a second thickness that is larger than the first thickness, wherein the blocking region is defined by having an implant and the one or more conductive channel cores are devoid of the implant, wherein the blocking region is lateral the one or more conductive channel cores, the blocking region and one or more conductive channel cores being an isolation region; and a non-planarized semiconductor region of one or more non-planarized semiconductor layers over the isolation region. In one aspect, the VCSEL can include a planarized bottom mirror region below the active region and a non-planarized top mirror region above the isolation region. In one aspect, the VCSEL can include a non-planarized bottom mirror region below the active region. In one aspect, the blocking region has a thickness from 1 nm to 500 nm, from 1 nm to 30 nm, from 1 nm to 10 nm, or from 1 nm to 3 nm. In one aspect, the conductive channel core has a thickness from 1 nm to 1000 nm, from 1 nm to 60 nm, from 1 nm to 20 nm, or from 1 nm to 6 nm. In one aspect, the conductive channel core has a diameter of about 1 micron to about 200 microns. In one aspect, the conductive channel core has a diameter of about 2 microns to about 6 microns. In one aspect, the plurality of the conductive channel cores is in a common blocking region. In one aspect, the conductive channel core has a higher refractive index than the blocking region. In one aspect, the VCSEL can include: devoid of an oxide aperture; devoid of oxidation; or devoid of a mesa having the isolation region therein. In one aspect, the implant is silicon or oxygen. In one aspect, the mirror layers in the non-planarized top mirror have a connected step such that a first non-planarized top mirror layer has a lower region above the blocking region that is connected to a higher region above the conductive channel core. In one aspect, the mirror layers in the non-planarized top mirror have a disconnected step such that a first non-planarized top mirror layer has a lower region above the blocking region that is disconnected to a higher region above the conductive channel core.

In one embodiment, a method of making the VCSEL of one of the embodiments. Such a method can include: forming the active region; forming the isolation region over the active region, the isolation region having the blocking region with the conductive channel cores; and forming the non-planarized semiconductor region of one or more semiconductor layers over the isolation region. In one aspect, the method can include: forming the isolation region, the isolation region having the blocking region with the conductive channel cores; and forming the non-planarized semiconductor region of one or more semiconductor layers over the isolation region. In one aspect, the method can include forming the blocking region and one or more conductive channel cores from a conductive layer by implanting a region of the conductive layer that becomes the blocking region and where one or more regions devoid of the implanting becomes the one or more conductive channel cores. In one aspect, the method can include: forming the blocking region; and etching the blocking region to have the first thickness that is smaller than the second thickness of the one or more conductive channel cores. In one aspect, the method can include: coating one or more regions of the top of the conductive layer with a photoresist that inhibits implantation and etching where the one or more regions with the photoresist define the one or more conductive channel cores and the region without the photoresist defines the blocking region; and implanting the region without the photoresist to form the blocking region. In one aspect, the method can include: coating one or more regions of the top of the conductive layer with a photoresist that inhibits implantation and etching where the one or more regions with the photoresist define the one or more conductive channel cores and the region without the photoresist defines the blocking region; implanting the region without the photoresist to form the blocking region; and etching the blocking region partially so as to leave a thinner blocking region. In one aspect, the method can include: removing the photoresist after the etching of the blocking region; and forming the non-planarized top mirror region after removing the photoresist, wherein the amount of etching of the blocking region defines an offset of upper mirror layers and lower mirror layers of the non-planarized top mirror region.

In one embodiment, a non-planarized VCSEL can include: an active region; one or more blocking cores over the active region, the blocking core having a first thickness; one or more conductive channel perimeters around the blocking core, the one or more conductive channel perimeters having a second thickness that is larger than the first thickness, wherein the blocking core is defined by having an implant and the one or more conductive channel perimeters are devoid of the implant, wherein the conductive channel perimeters are lateral to the one or more blocking cores, the conductive channel perimeters and the one or more blocking cores being an isolation region; and a non-planarized semiconductor region of one or more non-planarized semiconductor layers over the isolation region.

In one embodiment, a non-planarized VCSEL can include: an active region; one or more blocking cores under the active region and over a substrate, the blocking core having a first thickness; one or more conductive channel perimeters around the blocking core, the one or more conductive channel perimeters having a second thickness that is larger than the first thickness, wherein the blocking core is defined by having an implant and the one or more conductive channel perimeters are devoid of the implant, wherein the conductive channel perimeters are lateral the one or more blocking cores, the conductive channel perimeters and the one or more blocking cores being an isolation region; and a non-planarized semiconductor region of one or more non-planarized semiconductor layers over the isolation region.

In one embodiment, an array of VCSELs can include a plurality of the VCSELs of any of the embodiments described herein. The plurality of VCSELs are arranged in an ordered pattern, wherein the plurality of VCSELs includes a plurality of different types of VCSELs, each different type of VCSEL having a different characteristic.

BRIEF DESCRIPTION OF THE FIGURES

The foregoing and following information as well as other features of this disclosure will become more fully apparent

FIG. 2 is a schematic of an embodiment of a VCSEL layered semiconductor operating environment having the mirror layers of the outer current blocking region connected with the corresponding mirror layers of the central mode confinement region.

FIG. 2A shows a top view with a squared cross-section of an isolation region.

FIG. 2B shows a top view with a circular cross-section of an isolation region with etching to form a mesa.

DETAILED DESCRIPTION

Figure 1:
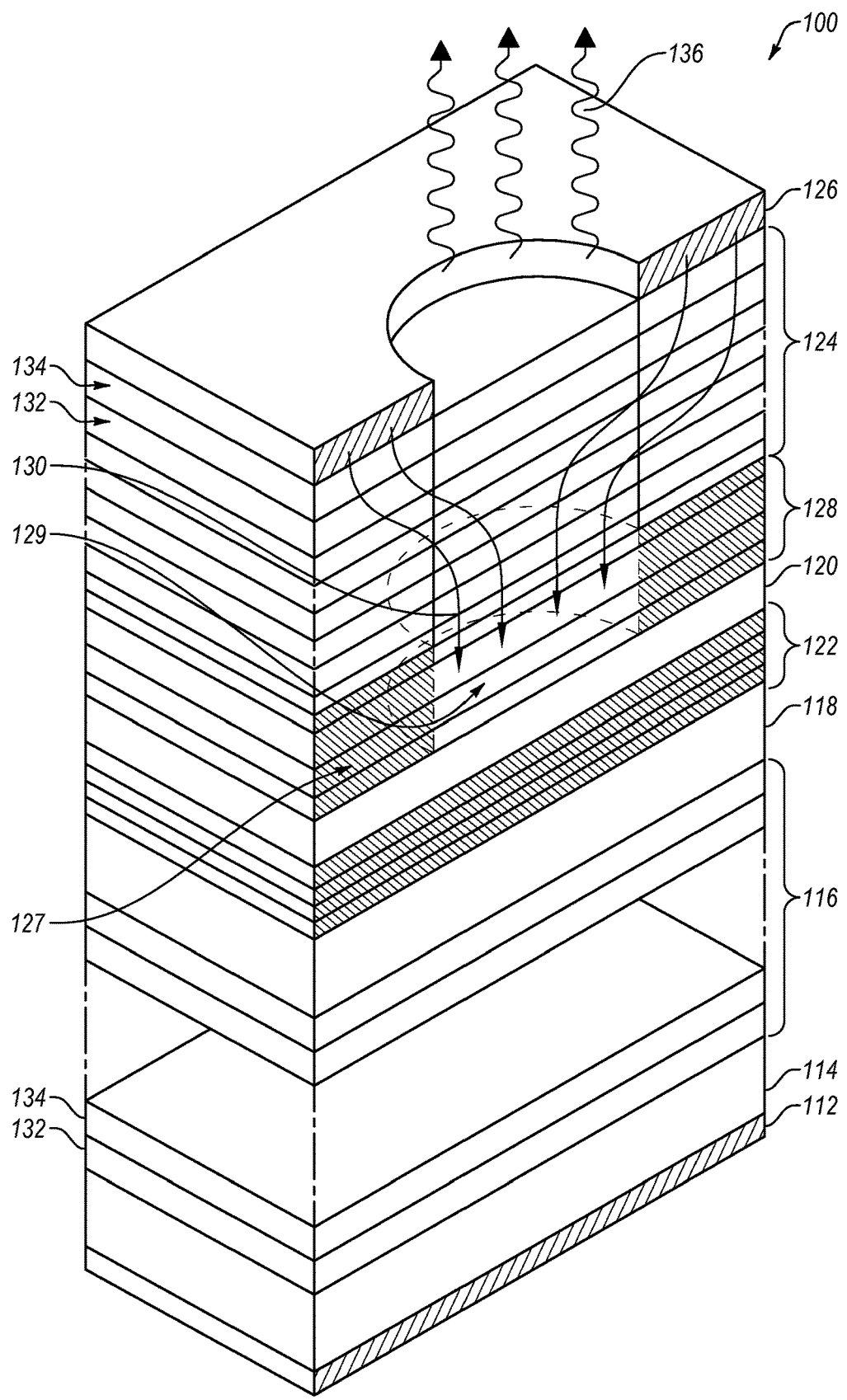
FIG. 1 is a schematic of an embodiment of a VCSEL operating environment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

Generally, the present advancement in VCSEL technology relates to a blocking region and conducting region formed by preparing a conducting layer that is protected in regions during implantation so that the protected region forms the conducting region and the implanted region forms the blocking region around the conducting region. Selective etching results in the blocking region and conducting region having different thicknesses in the vertical direction, and thereby are non-planarized. Then mirror layers are formed above the blocking region and conducting region in a non-planarizing format that results in stepped mirror periods. The conducting region can include a material that is more electrically conducting than the material of the implanted material of the blocking region during operation of the VCSEL and light emission in an active region. Accordingly, the blocking region and conducting region can form a heterojunction for selective current guidance. The conducting region can form a conducting channel through the blocking region. Otherwise, the VCSEL can be prepared as standard in the industry or as in the incorporated references.

The semiconductor devices of the present invention can be manufactured from any type of semiconductor. Examples of suitable materials include III-V semiconductor materials (e.g., prepared from one or more Group III material (boron (B), aluminium (Al), gallium (Ga), indium (In), thallium (Tl), and ununtrium (Uut)) and one or more Group V materials (nitrogen (N), phosphorus (P), arsenic (As), antimony (Sb), bismuth (Bi) and ununpentium (Uup) (unconfirmed)) and optionally some type IV materials.

The semiconductor device can include an active region having one or more quantum wells and one or more quantum well barriers. The quantum wells and quantum well barriers can be separated by one or more transitional layers therebetween. The transitional layers may also be referred to as interfacial layers, as they are located at the interface between the quantum wells and quantum well barriers. However, the active region can be configured as any known or developed in the art of VCSELs.

Optionally, electrical confining layers can sandwich the active region and provide optical gain efficiency by confining carriers to the active region. The confining layers can have a region of high energy band gap, which in the case of many III-V compounds translates to high aluminum content (e.g., 70%-100% Al for the type III material). The aluminum content can be selected to give the material a relatively wide band gap, as compared to the band gap in the quantum well barriers of the active region. The wide band gap material can give the confining layer good carrier confinement and increases the efficiency in the active region. In an exemplary embodiment, the high aluminum region may also include an increase in doping. The confining layer can be doped with a p-type or n-type dopant depending on whether the confinement barrier is on the n-side or p-side of the active region.

The heterojunction conductive channel configuration can provide improved fiber optic transceiver reliability, electro-optical bandwidth, and link distances by allowing implementation of small aperture (e.g., 2-6 μm) VCSEL devices. In high power VCSELs, the heterojunction conductive channel configuration allows higher maximum power per VCSEL, and more emitters per unit area in dense arrays.

This heterojunction conductive channel configuration enables more efficient mass production of guided mode VCSELs by allowing use of one or more MOCVD (metalorganic chemical vapor deposition) crystal growth steps in fabrication. As such, the process can omit lateral steam oxidization, or formation of any oxide aperture.

FIG. 1 shows a planar, current-guided, VCSEL 100 having periodic layer pairs for top (124) and bottom (116) mirrors. A substrate 114 is formed on a bottom contact 112 and is doped with a first type of impurities (i.e., p-type or n-type dopant). A bottom mirror stack 116 is formed on substrate 114 and an optional bottom confining layer 118 is formed on bottom mirror stack 116. An active region 122 is formed over the bottom mirror stack 116, or over the bottom confining layer 118 (when present). An optional top confining layer 120 is formed over the active region 122. In one optional aspect, the bottom confining layer 118 and a top confining layer 120 sandwich the active region 122. An isolation region 128 is formed over the active region 122 or over the optional top confining layer 120. The isolation region includes a lateral region blocking region 127 and a central conducting channel core 129. The bottom confining layer 118 and/or top confining layer 120 may be a spacer region between the active region and isolation region. Alternatively, the bottom confining layer 118 and/or top confining layer 120 may be a conducting region. Thus, any spacer region bounding the active region may be a confining region, conducting region, or semiconductor spacer that is not confining or conducting.

An upper mirror stack 124 is formed over the isolation region 128. A metal layer 126 forms a contact on a portion of stack 124. However, other VCSEL configurations may also be utilized, and various other VCSEL layers or types of layers can be used.

An isolation region 128 restricts the area of the current flow 130 through the active region 122. Isolation region 128 can be formed to include the lateral region blocking region 127 and a central conducting channel core 129 by depositing a conductive layer, protecting a central region of the conductive layer, using implantation to change the unprotected lateral region into the blocking region 127, and removing the protectant. The isolation region 128 can include a single layer blocking region 127 or multiple layers of blocking layers, and/or a single layer central conducting channel core 129 or multiple layers of central conducting channel core layers.

Mirror stacks 116 (bottom) and 124 (top) can be distributed Bragg reflector (DBR) stacks, and include periodic layers (e.g., 132 and 134, but may be switched from what is shown). Periodic layers 132 and 134 are typically AlGaAs and AlAs, respectively, but can be made from other III-V semiconductor materials. Mirror stacks 116 and 124 can be doped or undoped and the doping can be n-type or p-type depending on the particular VCSEL design. However, other types of VCSEL mirrors may be used.

Figure 2C:
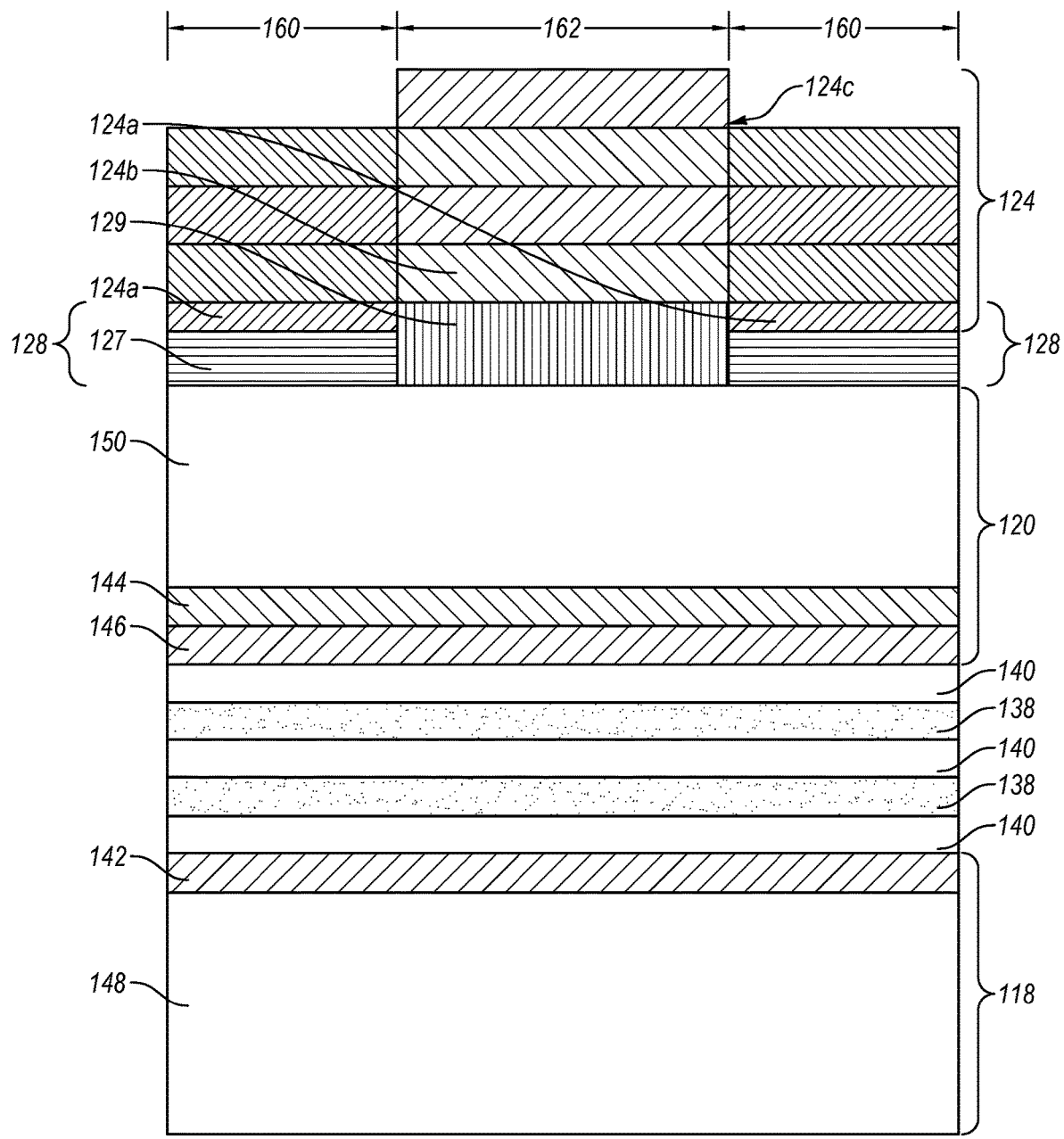
FIG. 2C is a schematic of an embodiment of a VCSEL layered semiconductor operating environment having the mirror layers of outer current blocking region disconnected with the corresponding mirror layers of the central mode confinement region.

The top mirror stack 124 can have stepped mirror layers as described herein, which can be connected stepped mirror layers as in FIG. 2 or disconnected stepped mirror layers as in FIG. 2C. The stepped mirror layers have a lower plane in the outer current blocking region and an upper plane in the central mode confinement region. The mirror layers in the top mirror are not planarized. The stepped mirror layers can be connected where there is a connection between the lower plane layer and upper plane layer. The stepped mirror layers can be disconnected, where there isn't a connection other than point touching between the upper plane and lower plane.

Metal contact layers 112 and 126 can be ohmic contacts that allow appropriate electrical biasing of VCSEL 100. When VCSEL 100 is forward biased with a voltage on contact 126 different than the one on contact 112, active region 122 emits light 136, which passes through top mirror stack 124. Those skilled in the art will recognize that other configurations of contacts can be used to generate a voltage across active region 122 and generate light 136.

FIG. 2 illustrates the active region 122 and confining layers 118 and 120 under isolation region 128 having the blocking region 127 and central conducting channel core 129. The blocking region 127 forms the outer current blocking regions 160, and the central conducting channel core 129 forms the central mode confinement region 162. Active region 122 is formed from one or more quantum wells 138 that are separated by quantum well barriers 140, where the transition layers may be the lines between the quantum wells 138 and barriers 140. The confining layers 118 and 120 may optionally include high aluminum content regions 142 and 144, respectively. The high aluminum content regions provide good carrier confinement in active region 122.

Confining region 120 can include a ramp region 146 that is positioned between active region 122 and high aluminum content region 144. As discussed below, the combination of high aluminum content region 144 and the ramp region 146 provides an injection structure with good carrier confinement and good electron injection.

Depending on the design of the VCSEL device and the thickness of the high aluminum content regions 142 and 144, the confining regions 118 and 120 can optionally include spacer layers 148 and 150, respectively. The thickness of spacer layers 148 and 150 can be dependent upon the kind of VCSEL device being fabricated. In a vertical cavity resonant device such as a VCSEL, the spacer layers provide resonant spacing between the mirrors and provide that the quantum wells of the active region are centered on a peak of the optical field if desired.

The confining layers 118 and 120 and active region 122 can be formed from one or more types of semiconductor materials, such as GaAs, AlAs, InP, AlGaAs, InGaAs, InAlAs, InGaP, AlGaAsP, AlGaInP, InGaAsP, InAlGaAs, SiGe, or the like.

In one example, the lower electrical confining layer is AlInP. In another example, the upper electrical confining layer can be AlInGaP.

FIG. 2 shows that the top mirror stack 124 includes alternating mirror period layers that are stepped, where each layer is stepped and connected. Each mirror period layer includes a lateral lower step 124a and a central upper step 124b that are connected by a step connection 124c. Mirrors have alternating layers. Here, each layer has a lateral lower step 124a and a central upper step 124b that are connected by a step connection 124c.

FIG. 2A shows a top view with a squared cross-section of an isolation region. FIG. 2B shows a top view with a circular cross-section of an isolation region with etching to form a mesa. A single chip may have a plurality of the isolation regions either planar as in FIG. 2A or etched to have a plurality of mesas on a single chip.

FIG. 2C shows an embodiment similar to FIG. 2; however, the lateral lower steps 124a are not connected to the central upper step 124b. Here, the top of one type of lateral lower step 124a is even or nearly even (nearly planar) with the top of the other type of central upper step 124b. Thus, while the layers may be planar, the lateral lower steps 124a of a first material are planar with the central upper step 124b of the second material, and the lateral lower steps 124a of the second material are planar with the central upper step 124b of the first material. The lateral lower steps 124a form the outer current blocking region. The central upper steps 124b form the central mode confinement region. It should be recognized that corresponding lateral lower steps 124a and central upper steps 124b may be made of the same material during the same deposition protocol; however, the height difference between the blocking region 127 and central conducting channel core 129 cause formation of the steps.

The VCSEL heterojunction conductive channel configuration can be formed to include a heterojunction current blocking region, with a conductive channel formed by laying a conductive layer, protecting a channel region of the conductive region, implanting the conductive layer around the protected channel region where the implanted region becomes the blocking region. The conductive channel region has a higher refractive index and can be considered to be a conductive channel core when the lateral region is implanted to become a blocking region having a lower refractive index and lower electrical conductivity than the conductive layer. The blocking region can be a lower refractive index perimeter. The refractive index of the blocking region being lowered by implantation can be comparative to the higher refractive index of the conductive channel core. This allows formation of guided optical modes. Now with the heterojunction conductive channel configuration, a VCSEL or VCSEL array can be more readily fabricated using standard MOCVD technology and other standard fabrication techniques that are currently employed in high volume VCSEL manufacturing.

Figure 3:
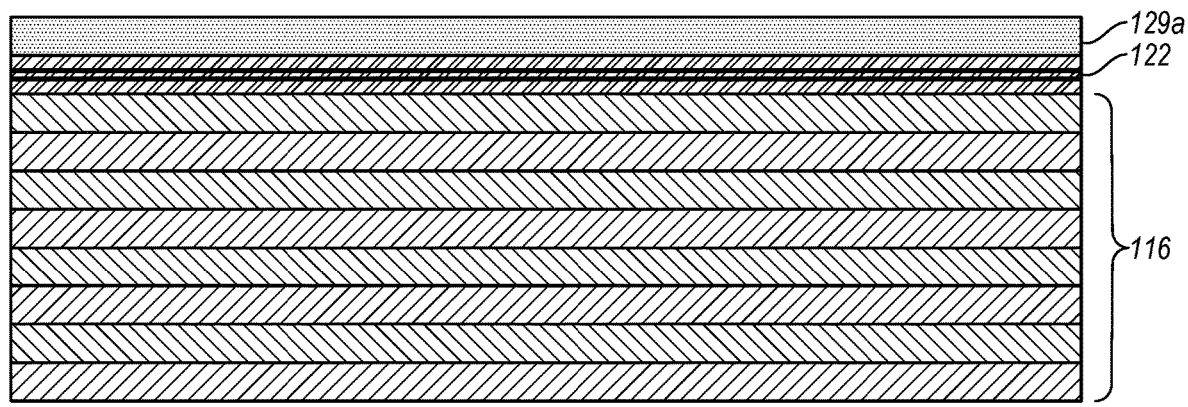
FIG. 3 is a diagram of first growth showing N-type DBR mirrors, and active region with QWs capped with a conducting layer.

In one embodiment, a method of manufacture of the VCSEL with the heterojunction conductive channel configuration can include forming a mirror region 116, forming an active region 122 over the mirror region 116, and forming a conducting layer 129a over the active region 122. This process is shown in FIG. 3. FIG. 3 shows a diagram of first growth showing N-type DBR mirrors, active region with QWs capped with blocking region. The formations can be by MOCVD.

Figure 4:
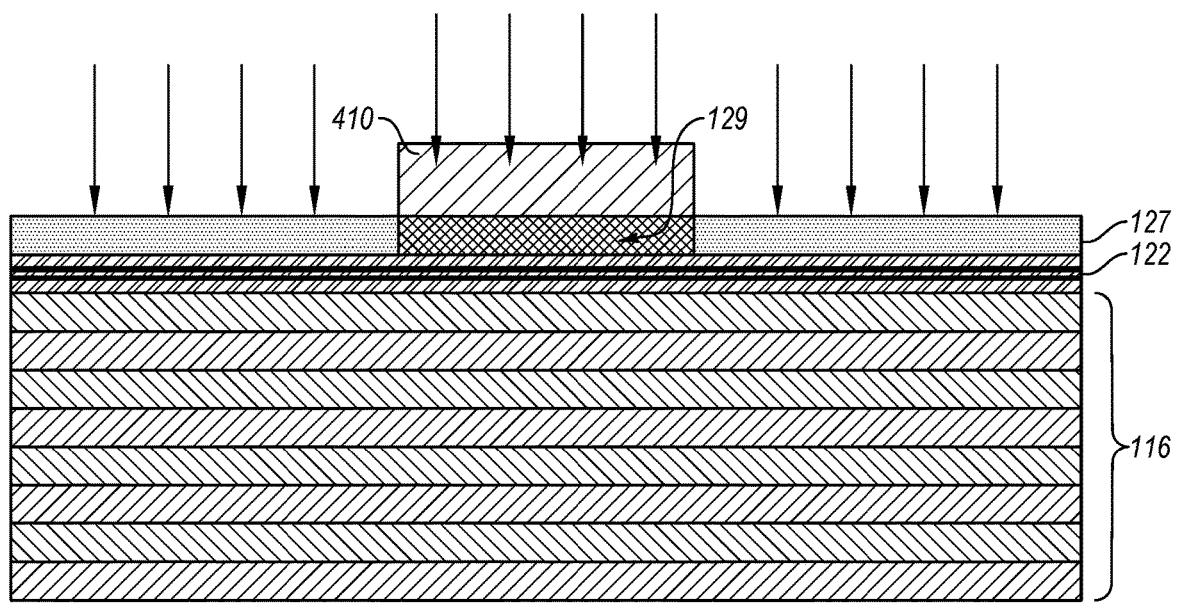
FIG. 4 is a diagram showing an implant blocking photoresist that inhibits implanting in a central region of the conducting layer, where implanting forms a current blocking region laterally of the central region.

The confining layer 120 can then receive an implant blocking photoresist 410 over a blocked region of the conducting layer 129a, which becomes the conductive channel core 129, as shown in FIG. 4. FIG. 4 shows a diagram of first growth showing N-type DBR mirrors, and active region with QWs capped with current blocking region formed by ion implantation. A photoresist mesa blocks the ion implant in the center conductive aperture region. The process then includes using implantation, such as low energy, low dose implantation (e.g., as shown by the arrows) to change the unblocked region into a current blocking region 127. The center becomes the conductive aperture, which is the conductive channel core 129. The lateral region becomes the blocking layer 127 due to the implantation.

The blocking layer 127 is not subject to aggressive oxidation in air that interferes with MOCVD based regrowth. Thus, the use of MOCVD can be beneficial for re-forming the heterojunction conductive channel configuration.

Figure 5:
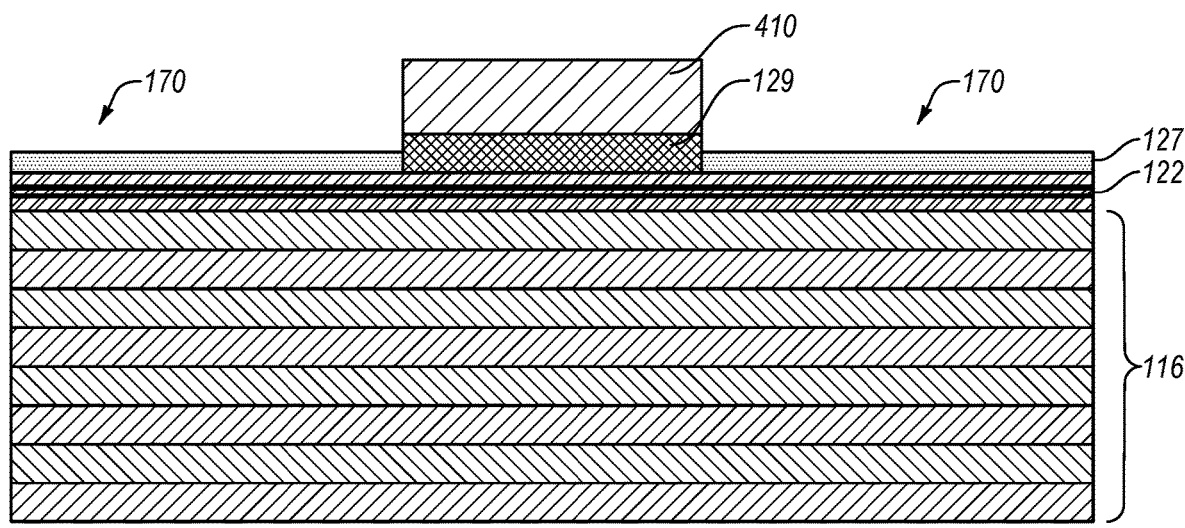
FIG. 5 is a diagram showing etching of the current blocking region where the photoresist inhibits etching above the central region.

With the photoresist 410 still in place, a portion of the blocking layer 127 is removed by wet chemical etch to transition from the structure of FIG. 4 to the structure of FIG. 5. The entire blocking layer 127 is not etched so that the blocking layer 127 with reduced height or thickness is retained having the etched regions 170. Before etching, the blocking layer 127 can have a height or thickness, and after etching can have a height or thickness that is 10%, 25%, 50%, 75%, 80%, or 90% of the height or thickness before etching. The result is an etched blocking region and central optical guiding mesa.

Figure 6:
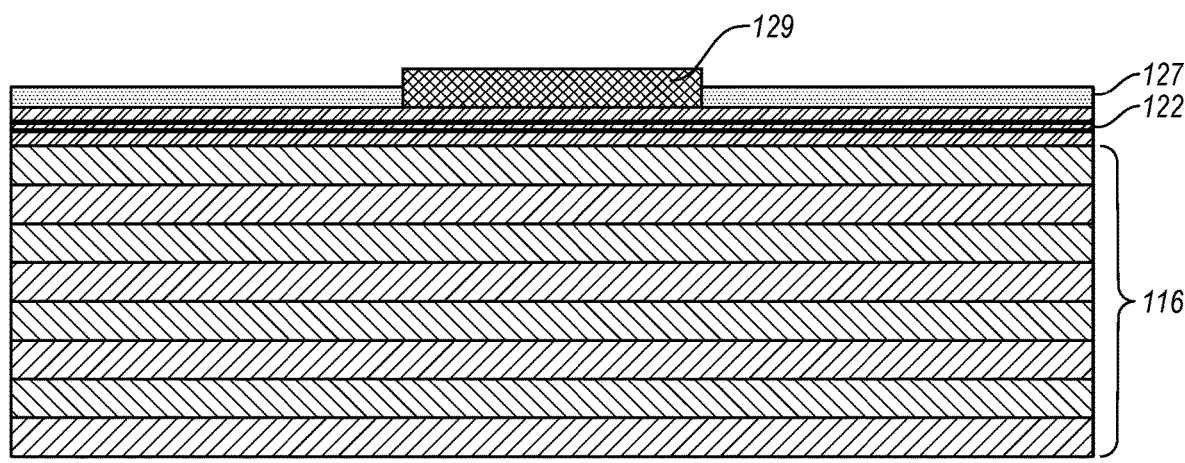
FIG. 6 is a diagram showing removal of the photoresist to result in a blocking region surrounding a conductive channel core.

FIG. 6 shows that the photoresist 410 is removed to leave the blocking layer 127 having the conductive channel core 129 as a mesa.

In one example, the conductive layer and conductive channel core can be $Al_{0.15}Ga_{0.85}As$.

However, it should be recognized that the etch and removal of the photoresist 410 may be in a single step.

Figure 7:
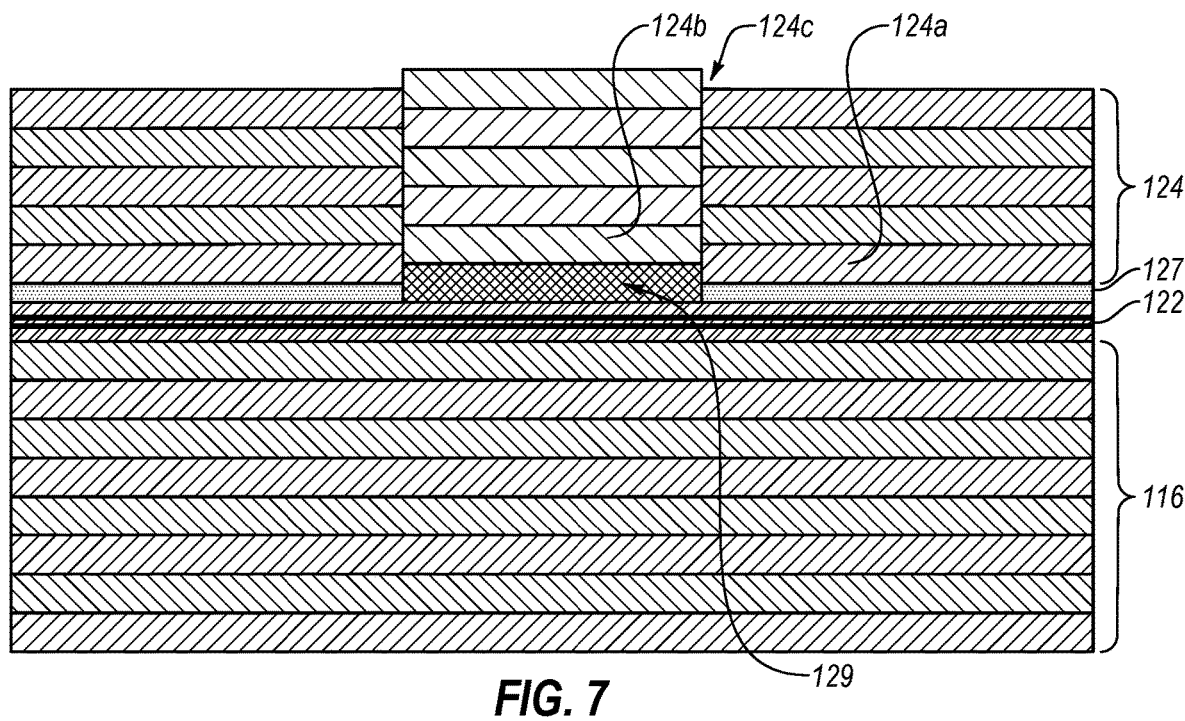
FIG. 7 shows non-planarizing regrowth that results in stepped mirror layers.

After etching and removing the photoresist 410, non-planarizing regrowth is performed to form the mirror regions 124 as shown in FIG. 7. The non-planarizing regrowth is implemented by selection of MOCVD growth parameters to obtain higher attainable growth rates. The conductive channel core 129 being a mesa compared to the blocking layer 127 results in non-planarizing regrowth so that each mirror layer has a step at the conductive channel core 129. This can achieve the top mirror 124 of FIG. 2 or FIG. 2C depending on whether the steps are connected or disconnected. The height of deposition and the amount of etching can determine whether the structure of FIG. 2 or FIG. 2C is obtained. When the bottom mirror is P-doped, the top mirror can be N-doped and the other layers of the VCSEL correspondingly formulated.

Figure 8:
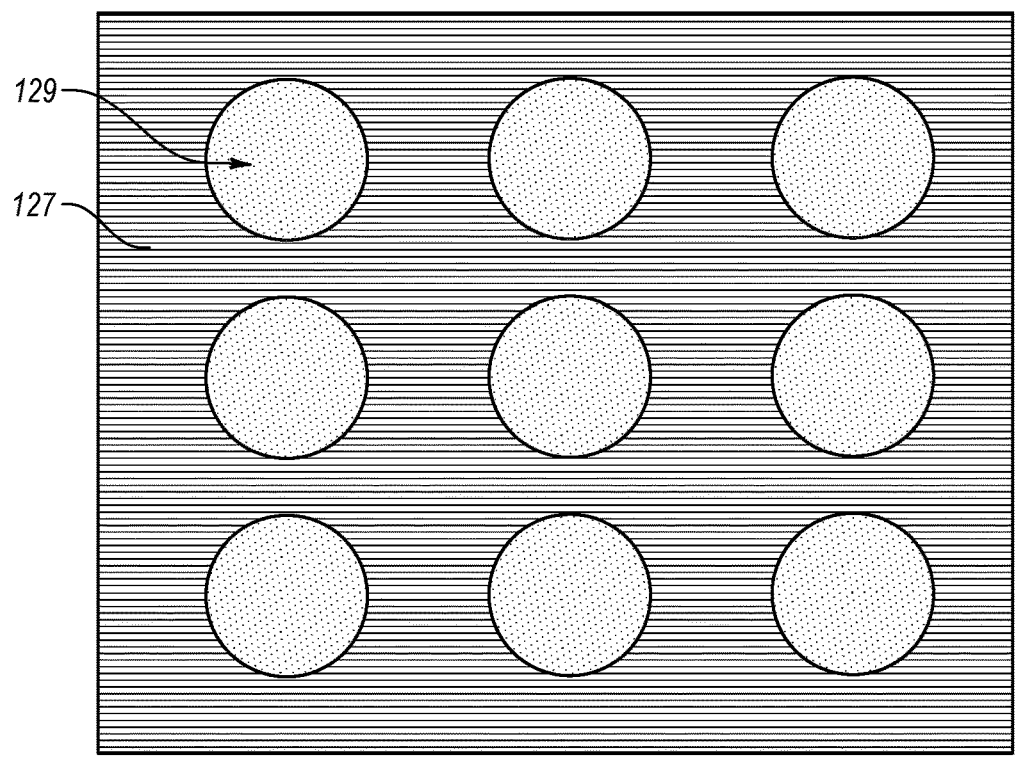
FIG. 8 is a diagram showing a plurality of conductive channel cores in a common blocking layer.
Figure 8A:
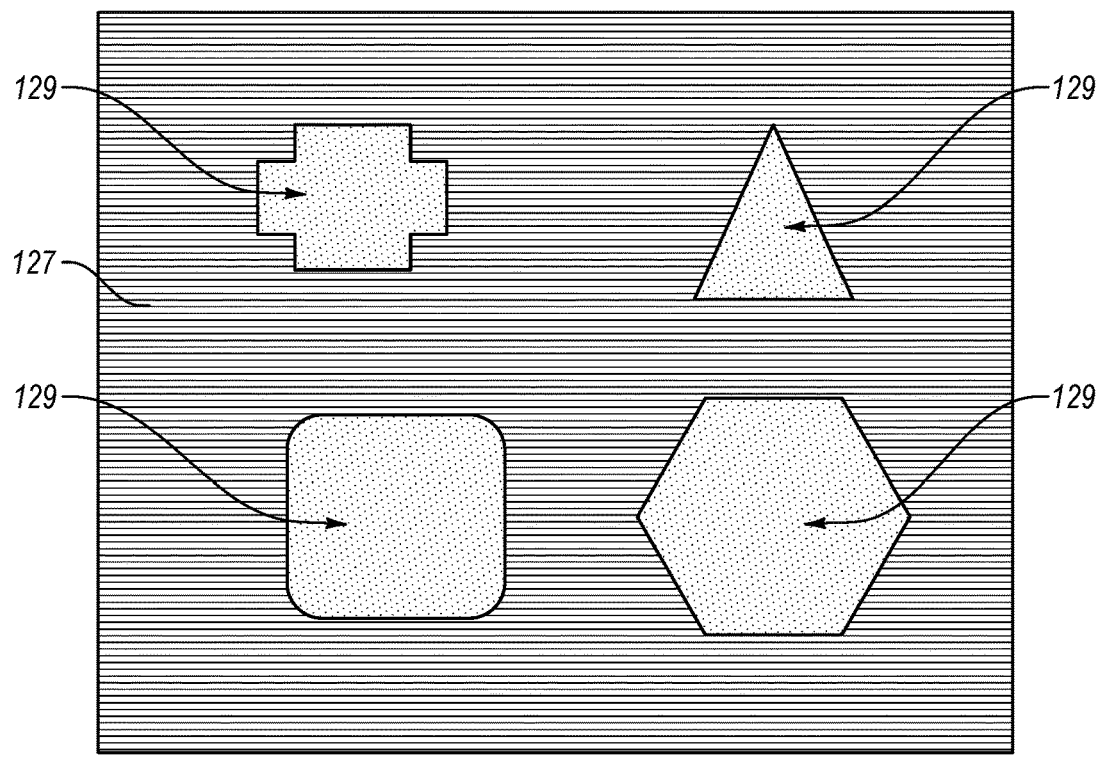
FIG. 8A is a diagram showing a plurality of conductive channel cores having complex shapes in a common blocking layer.

In one embodiment, a single substrate can include a plurality of VCSEL emitters, which can be formed into an array. A macro substrate with a macro conducting layer can be protected with a plurality of photoresists, implanted at the non-protected regions to form the blocking regions, etching the implanted blocking regions, and then forming non-planarized mirror layers above the stepped implanted blocking regions and non-implanted conductive channel cores. The number of locations having the photoresist protecting against implantation and etching can define the number of light emitting regions in the array of VCSELs. Each conducting channel core can be an individual light emitting device that use a heterojunction current blocking region (implanted and etched) and a stepped up center conductive channel, and the entirety of the stepped up conducting channels and blocking regions can receive subsequent regrowth thereof with non-planarizing layers. FIG. 8 shows such a laser array of VCSEL emitters on a single substrate. Each VCSEL emitter can include a conductive channel core 129, where all VCSEL emitters are each surrounded by a common blocking layer 127. FIG. 8A shows that the photoresist can be applied as a complex shape, which results in forming the conductive channel core 129 into complex shapes.

The VCSEL array can include any number of VCSELs in an array format. However, an embodiment of the VCSEL array can include a plurality of the implant regrowth VCSELs (e.g., emitters) described herein where the plurality of VCSELs include a plurality of different types of implant regrowth VCSELs. As such, some of the emitters have a different characteristic from some of the other emitters. This results in an implant regrowth VCSEL array with a heterogeneous combination of different types of VCSELs. The different types of implant regrowth VCSELs can include a plurality of different dimensioned VCSELs (e.g., different diameters of the conducting channel core), a plurality of different shaped VCSELs (e.g., different shapes, ranging from circular, non-circular, oval, square, quadrangle, triangle, complex shapes, or the like), a plurality of different orientations (e.g., symmetry or asymmetry oriented at angles with respect to each other), and/or a plurality of different divergence angles (e.g., divergence angles of the emitted light varies between different VCSELs). Accordingly, the spacing and location of the VCSELs may be uniform, a pattern, a shape, even, periodic and/or regular or repeating; however, the type of VCSEL (e.g., shape and/or size and/or orientation) may be heterogeneous. As such, the location of the VCSELs in the array may be ordered, but the type of VCSEL can be varied across the array.

The VCSEL array may have the individual VCSELs arranged in a pattern, such as each VCSEL being located at a corner of a triangle, square, rectangle, other quadrangle, pentagon, hexagon, or any other polygon, and/or individual VCSELs may be arranged at the corners and midpoints, or at the midpoints, or any other uniform arrangement. However, the plurality of VCSELs in the array may be a heterogeneous combination of different VCSEL types. The pattern may be considered to a regular array with the location of each VCSEL being in an orderly manner in a pattern, such as a repeating pattern of any type. The individual VCSELs are not in a random arrangement.

In one embodiment, a chip or wafer can include a regular array lattice of implant regrowth VCSELs, such as those formed as described herein, with varied aperture size and/or aperture shape or any other change or difference between VCSELs across the array. The different types of apertures can be defined by lithography as described herein, instead of lateral oxidation. The different types of apertures in the VCSEL array can be used in the applications described herein, or any application that uses a highly dense array of VCSELs. In some additional examples, the VCSEL array of heterogeneous VCSEL types can be used for applications such as 3D scanning, gesture, and facial recognition as well as others. In one example, the VCSEL array with heterogeneous VCSEL types can be used in a screen, such as a touch screen, for a mobile device (e.g., mobile phone, tablet, etc.). In another example, the VCSEL array can be used in structure light.

In one embodiment, the VCSEL array can include a regular lattice pattern of emitter locations (e.g., VCSELs) with a heterogeneous mixture of emission aperture shapes, sizes, orientations, and/or divergence angles. The heterogeneous variation of emission apertures and their close proximity (e.g., <30 microns or other proximities as described herein) is enabled by the method of forming the implant-regrowth VCSEL with lithographically defined aperture shapes and etched step height for numerical aperture (NA) definition. Since each subarray of the 3-6 (or other integer) nearest neighbor emitters in the array can have a unique configuration, a regular array with a heterogeneous emitter mixture can be used in structured light projector applications such as 3D sensing and gesture recognition.

In one embodiment, the VCSEL array with heterogeneous combination of different types of VCSELs can be used in the technology of U.S. 2013/0038881 (incorporated herein by specific reference in its entirety), and thereby the use of random VCSEL arrays therein may be substituted for the VCSEL array with heterogeneous combination of different types of VCSELs as described herein. For example, the VCSEL array with the regular pattern having the heterogeneous mixture of emitters can be used in a 3D mapping system, projection assembly, integrated optical projection modules, or other embodiment of this incorporated reference.

In one embodiment, the VCSEL array with heterogeneous combination of different types of VCSELs can be used in the technology of U.S. 2013/0250066 (incorporated herein by specific reference in its entirety), and thereby the VCSEL array with heterogeneous combination of different types of VCSELs can be used instead of an array of identical VCSEL emitters or emitter array in this incorporated reference. For example, the VCSEL array with the regular pattern having the heterogeneous mixture of emitters can be used in a 3D camera, 3D projector, or other 3D imaging apparatus.

Figure 8B:
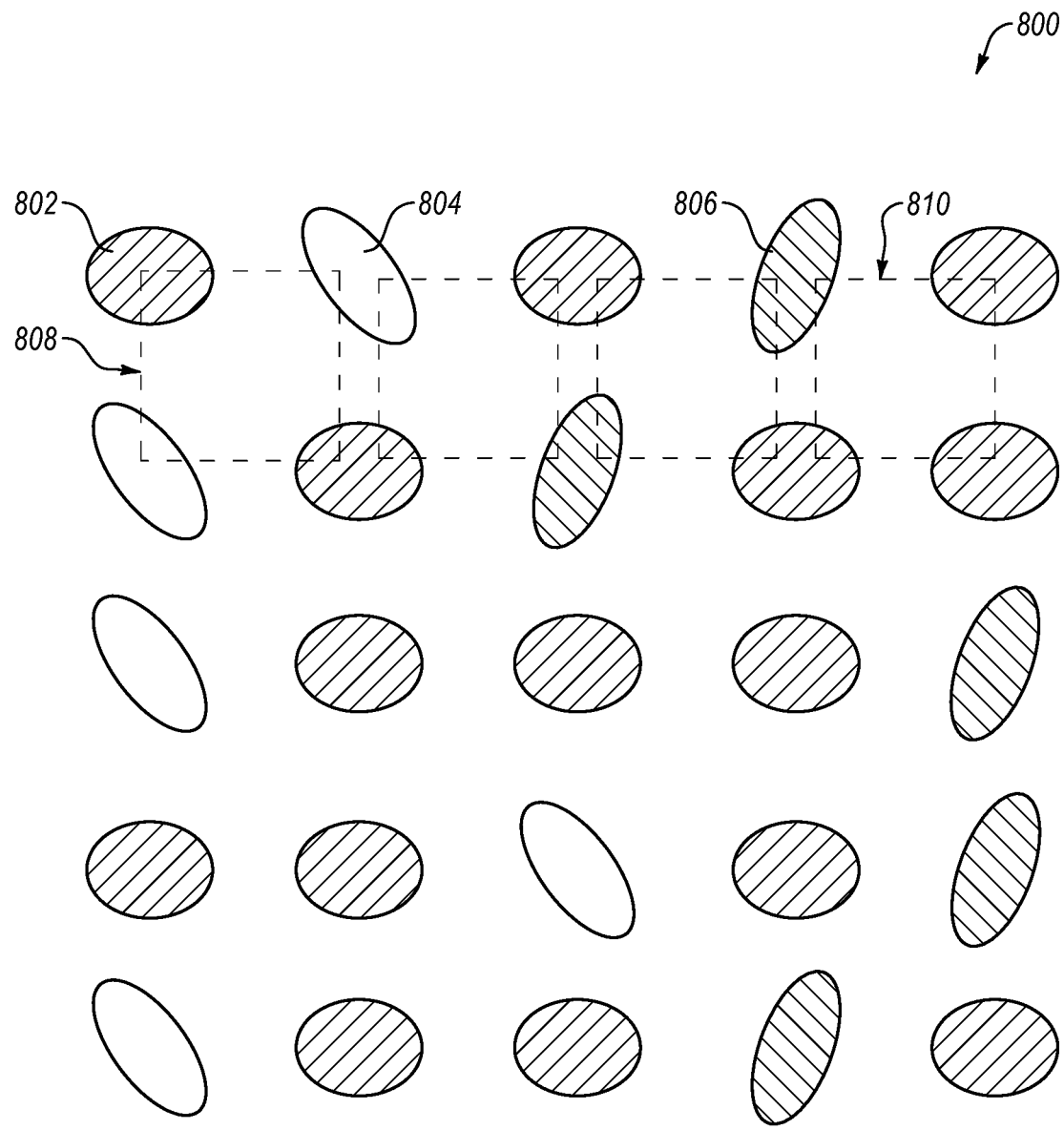
FIG. 8B is a diagram showing a VCSEL array in a regular pattern of aligned rows and columns with a heterogeneous combination of different types of VCSELs.

FIG. 8B illustrates an embodiment of such a VCSEL array 800 with heterogeneous combination of different types of VCSELs 802, 804, 806. Here, the VCSEL array 800 includes circular VCSELs 802, first angled elliptical VCSELs 804, and second angled elliptical VCSELs 806. However, other shapes, sizes, orientations (e.g., angle), and divergence angles may be used. The combination of four of the VCSELs can be used for a four emitter sub-array 808, which is unique compared to other four emitter sub-arrays 810. FIG. 8B shows a square sub-array. However, the sub-array may be any shape, such as any polygon. Other patterns may also be used. While the VCSEL array is shown to be in aligned columns and rows, the columns and/or rows may be in a staggered arrangement that is still considered to be a regular pattern.

Figure 8C:
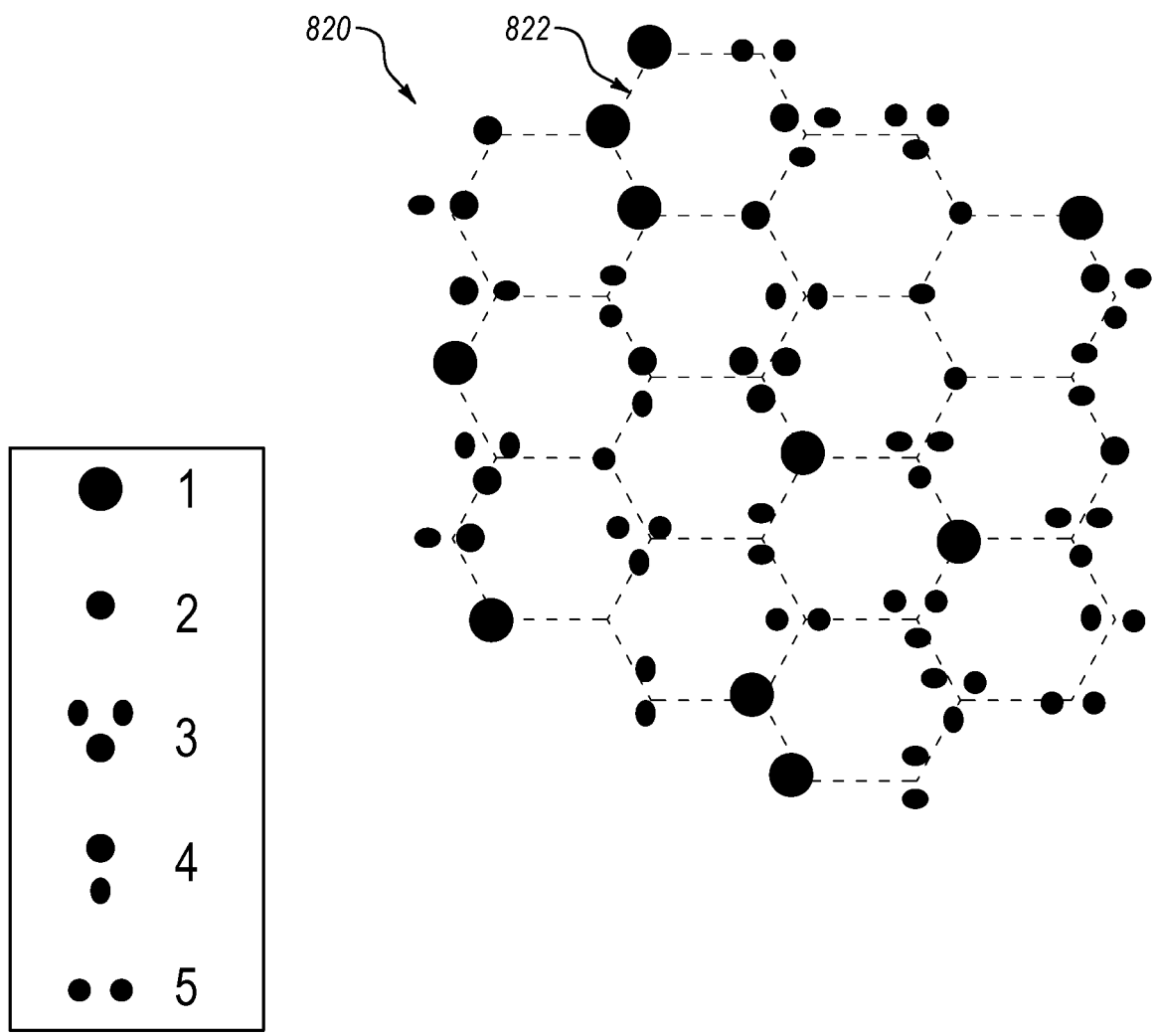
FIG. 8C is a diagram showing a VCSEL array in a regular pattern in a hexagonal arrangement with a heterogeneous combination of different types of VCSELs.

FIG. 8C shows that other polygonal sub-arrays, such as hexagonal arrays 820 are possible. As shown, the hexagonal array 820 has corners for each hexagon 822, and at the corner is one or more individual VCSELs. For example, VCSEL 1 is a larger circular shape, VCSEL 2 is a smaller circular shape, VCSEL 3 includes three closely located emitters, VCSEL 4 includes two closely located emitters oriented vertically (e.g., in a first direction), and VCSEL 5 includes two closely located emitters oriented horizontally (e.g., in a second direction, such as at an angle or orthogonal with the first direction). As noted, the pattern in FIG. 8C is not random, but an organized regular hexagonal pattern where each hexagon corner has a different emitter type of one or more emitters. FIG. 8C shows a hexagon sub-array. Any other polygon pattern array may have the VCSELs 1, 2, 3, 4, or 5 or other similar to as shown in FIG. 8C.

Figure 8D:
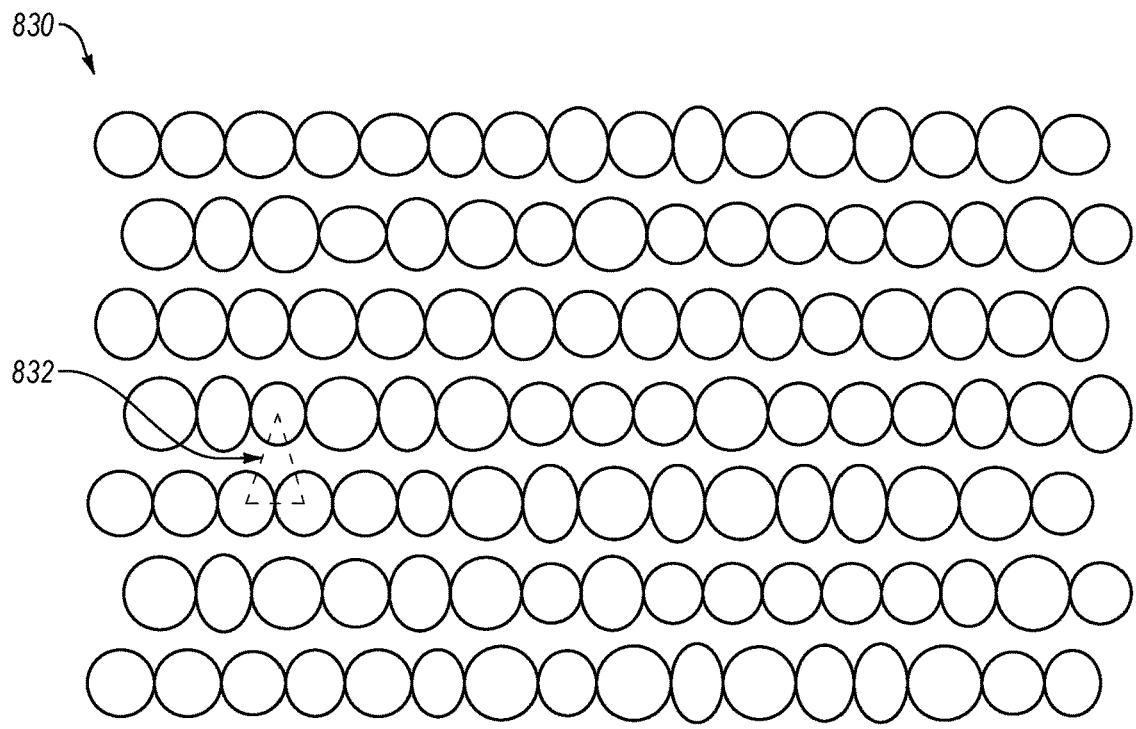
FIG. 8D is a diagram showing a VCSEL array in a regular pattern of aligned rows that are spaced apart and staggered columns with a heterogeneous combination of different types of VCSELs.

FIG. 8D shows a staggered array 830 having a tightly packed, dense regular VCSEL array of different types of VCSEL emitters, which are shown to have different shapes, such as circular and oval, that may have different dimensions. The overall pattern shape is considered to be staggered as the top row as a pattern, and the next row down has the emitter between two emitters in the row above, and this pattern continues across the entire tightly packed, sense regular array. FIG. 8D shows a triangle sub-array 832.

Figure 8E:
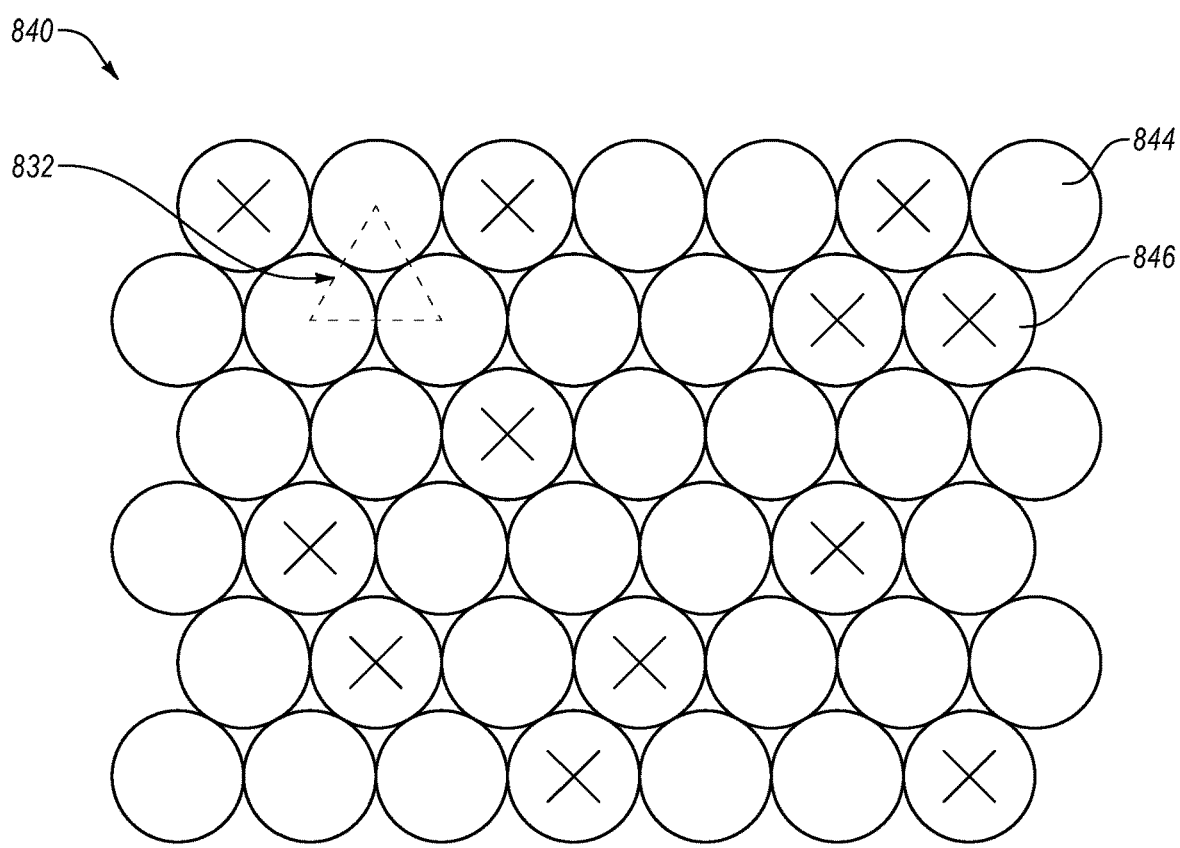
FIG. 8E is a diagram showing a VCSEL array in a regular pattern of aligned rows and staggered columns with a heterogeneous combination of different types of VCSELs.

FIG. 8E shows another staggered array 840 having a dense emitter array with hexagonal packing, which is similar to FIG. 8D. Here, however, random emitters are on and functional, such as functional emitters 844. Some random non-functional emitters 846 are turned off, which is shown by the X. The X non-functional emitters 846 are not functional, but they may be configured to turn on. As such, the pattern is a regular pattern, but random emitters are not functional. The pitch may be as small as 5 microns, such as described herein. FIG. 8E shows a triangle sub-array. In one aspect, the functional emitters 844 and non-functional emitters 846 may change, such as by a program or in real time, or they may be set. This allows for the regular pattern in the staggered array 840 to function as a random array when the non-functional emitters 846 are randomly distributed. Also, the ability to turn on emitters to be functional emitters 844 and then turn off the emitters to be non-functional emitters 846 allows for tailoring the emitted light, which may be beneficial in structured light and any use described herein.

The present configuration can result in a VCSEL devoid of an oxide aperture because the processing does not use lateral oxidation that can damage the semiconductor layers. The use of the blocking layer with a conductive channel core uses semiconductor material with better thermal conductivity. The thermal conductivity is better because of aluminum arsenide layers in the top mirror, and processing does not oxidize them. The bottom mirror can use binary materials. The reliability of the VCSEL can also be increased because the manufacturing method does not include cutting a trench near the active region and oxidizing into the semiconductor.

Reliability of the VCSEL can be improved when the device operates at lower temperatures. In the current state of the art, the oxide confined VCSEL heats more because of the low thermal conductivity of the oxide layer. Trenches are cut in the device to allow the oxide layer to form. As such, the VCSELs provided herein can be devoid of such an oxide layer and/or trenches that allow oxide layers to form.

Most of the problems with laser device reliability are related to some kind of chemical process being set in motion at the tip of that oxidation layer. Some reliability problems occur at the oxide tip because of the stress induced by the oxide layer. Most reliability problems are exacerbated at high temperatures. The oxide confined lasers have reliability problems as a result of physical interaction with the oxidation layer, where stress at the oxidation layer drives defects to form in semiconductor layers. In view thereof, it is expected that the lasers described herein should have less defects and less defect formation even at higher temperatures by lacking the oxide layers. The present implant VCSELs can have improved reliability by not having the oxide layer.

Now with the present technology, very small stepped up conductive channel cores can be formed by the etched stepped down blocking layer to form one or more laser devices with improved reliability. The very small stepped up conductive channel cores can now be very close to each other. For example, the individual conductive channel cores can have diameters (or other cross-dimensions) of from 1 micron to 10 microns, from 1.5 microns to 5 microns, from 2 microns to 4 microns, or about 2.5-3 microns. The individual conductive channel cores can be separated by distances (e.g., minimum distance apart) from 1 micron to 10 microns, from 1.5 microns to 5 microns, from 2 microns to 4 microns, or about 2.5-3 microns. This can include 1, 2, 3, 4, 5, 6, 7, 8, 9, 10, or more lasers on a common chip, where one or more (e.g., 4 or 5) can be coupled into a common optical fiber.

In one embodiment, the device can include a shallow implant. The shallow implant can be effective in terms of current blocking capability. It also is sort of a geometrical stability and the real new technology here is re-growing on top of the shallow implant.

Common to chemical etching, a mask can be used to define the etching part and non-etching part. A mask or other chemical blocking material can be placed on the stepped up conductive channel cores defining where the chemical etch will not occur. In one example, MOCVD deposition is used to form the conductive channel core.

Figure 9:
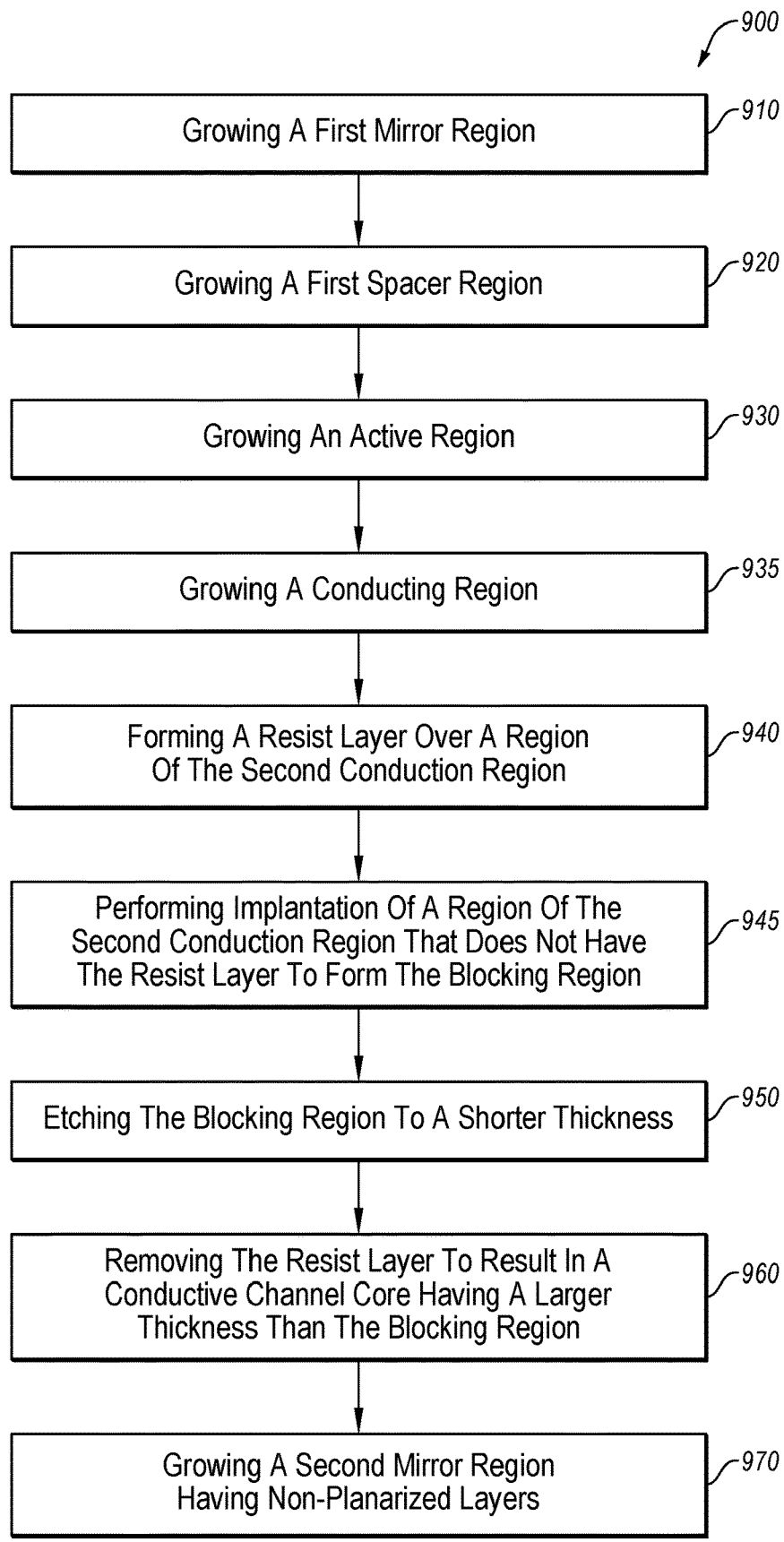
FIG. 9 is a flow diagram of an embodiment of a method of manufacturing a VCSEL.

FIG. 9 is a flow diagram of another process 900 of an embodiment of a method of manufacturing a VCSEL as described herein. The process can include growing a first mirror region having a plurality of first mirror layers having one or more indices of refraction (block 910) and then (optionally) growing a first spacer region over the first mirror region (block 920). Then an active region is grown over the first spacer region (block 930) (or over the first mirror when the first spacer region not grown). Then a conducting region is grown over the active region (block 935). Then a resist layer is formed over a region of the conducting region (block 940). Performing implantation of a region of the conducting region that does not have the resist layer, where the implanted regions become the blocking region (block 945). Then etching the blocking region from a first thickness to a shorter second thickness (block 950). Then the resist layer is removed (block 960) to form the conductive channel core having a higher step level than the blocking region (e.g., forming the conductive channel core as a mesa compared to the blocking region). The process 900 can also include growing a second mirror region having a plurality of non-planarized second mirror layers having one or more indices of refraction (block 970), wherein the non-planarized second mirror layers have a connected or disconnected step.

Also, the active region or whole semiconductor layers of a VCSEL can be produced with molecular beam epitaxy (MBE). Lower growth temperatures during the MBE can be used to prepare the VCSEL semiconductor layers. The growth of these structures by MBE can be performed at < (less than) 500° C. Comparatively, the temperatures for MOCVD can be > (greater than) 600° C. Additionally, the VCSELs can be prepared by methods that are similar to MBE, such as GSMBE (gas source MBE) and MOMBE (metalorganic MBE) or the like that can produce the regions as described.

The implantation and chemical etching can be any that is useful and known in the art.

In one embodiment, the VCSEL having the stepped up conductive channel core over the blocking region can be prepared by forming an ion implanted current blocking region as shown in FIG. 4. The conductive channel core is formed by blocking the implantation with photoresist. The conductive channel core has a higher refractive index.

Also, the region of higher effective refractive index from the shallow etch allows the guided mode formation. Without the etch, the processing can result in an implant only structure, similar to the first commercial VCSELs used. These devices have high threshold, irregular optical modes, as well as low speed and low wall plug efficiency. The shallow etch described herein can allow the device to be guiding. The shallow edge allows the higher refractive index.

The blocking region is then shortened (etched to have a shorter height) by a shallow etch, as shown in FIG. 5 (before removing the photoresist) and in FIG. 6 after removing the photoresist). P-DBR mirrors are then re-grown on top of this structure as shown in FIG. 7 to form the non-planarized mirror layers having the step up. The device can be fabricated using standard MOCVD technology, and standard implantation and etching techniques employed in high volume VCSEL manufacturing.

In one embodiment, an effective low dose, high ion mass implant process does not interfere with regrowth or severely compromise device performance. In one example, Si ions can be used during implantation for conversion of the blocking layer to N-type, or oxygen for blocking based on crystal damage. In one example, the blocking region can be N-type compared to P-type conductive channel core. In one example, the blocking region can be damaged relative to the undamaged conductive channel core.

The range of implant dose, energy, and species may be varied as described herein.

In one embodiment, the implant can be an N dopant. An N dopant may require activation. For example, Si is most commonly used as an N dopant; however, S and Se are other possibilities. In one example, implementation of an N implant requires high temperature annealing, such as >850° C. for activation. Implant damage is also eliminated in this process. When using Si and activating it as a dopant, the implant blocks current by forming a reverse bias PN junction. However, the semiconductor crystal is not damaged with Si as the implant, and may result in the implant region being more transmitting. When the implant substance is Si, then the GaAs or AlGaAs in the conductive layer can be converted from a P-type semiconductor to an N-type semiconductor.

In another embodiment, for a blocking approach, heavier ions whose damage do not anneal out during regrowth are used for the implant. Examples of such implants can include O, B, or F. The use of O, B, or F as implants can cause damage to the semiconductor that turns it into an insulator. In one aspect after using O, B, or F as implants, the semiconductor can be analyzed to determine if the crystal is overly damaged, and if not overly damaged, then further crystal growth (e.g., regrowth) can be performed over the implanted region.

In one embodiment, the junction between the conductive channel core and blocking regions may not be a heterojunction. The blocking region can be an implanted region that is then etched to be shorter or have a smaller thickness compared to the conductive channel core. The etch can result in the conductive channel core being a mesa extending above the blocking region.

In one embodiment, the implant in the isolation region and blocking region is not a proton implant.

It is noted that the same photoresist can block the implantation and block etching.

The non-planarized layers can be completely offset or minimally offset. That is, the offset can be 10%, 20%, 30%, 40%, 50%, 60%, 70%, 80%, 90%, or 100% (completely offset). The offset provides for causing optical guiding in the center region above the stepped up layers.

In one embodiment, the device manufactured as described herein is not an intercavity contacted device. This can include the device being prepared without significant doping in the center and high loss accompanied therewith. The present device can have higher heat dissipation without the intercavity contact.

In one embodiment, the structure for the top mirror in FIGS. 1 and 2-2C can be included in the bottom mirror. Correspondingly, the methodology of FIGS. 3-7 can be performed for the bottom mirror, with the alteration of the methods being employed over the substrate rather than the active region. Also, the method recited in FIG. 9 can be modified to be implemented on the substrate with the bottom mirror instead of over the active region with the top mirror.

However, it should be recognized that the procedures can be applied to both the top mirror and bottom mirror to form the non-planarized layers (P or N).

In one embodiment, the blocking region can be in the bottom mirror only, top mirror only, or bottom and top mirrors.

Figure 10:
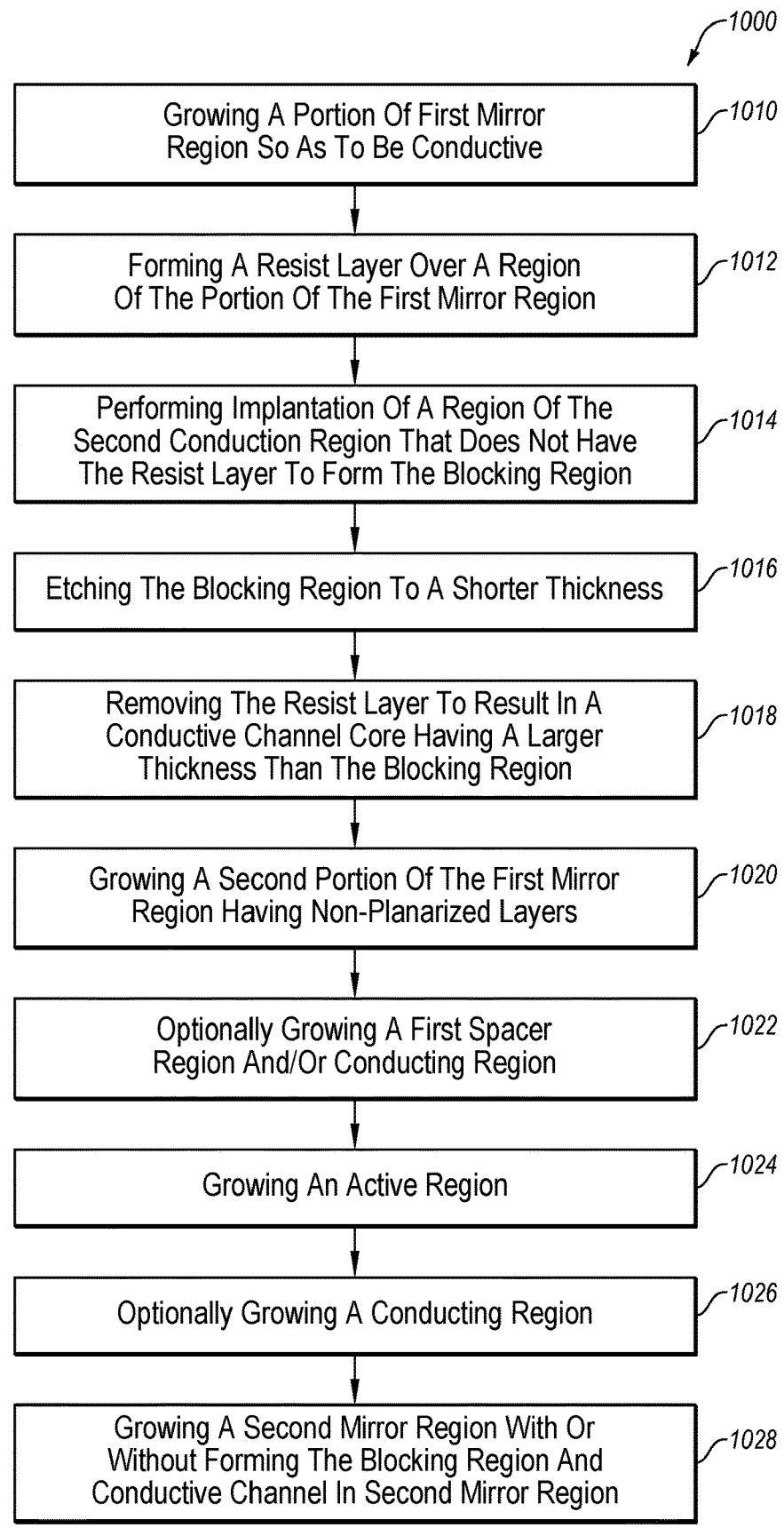
FIG. 10 is a flow diagram of an embodiment of a method of manufacturing a VCSEL.

FIG. 10 is a flow diagram of another process 1000 of an embodiment of a method of manufacturing a VCSEL as described herein. The process can include growing a portion of a first mirror region having a plurality of first mirror layers having one or more indices of refraction, which can be conductive (block 1010). Then a resist layer is formed over a region of the portion of a first mirror region (e.g., conducting region) (block 1012). Performing implantation of a region of the portion of a first mirror region that does not have the resist layer, where the implanted regions become the blocking region (block 1014). Then etching the blocking region from a first thickness to a shorter second thickness (block 1016). Then the resist layer is removed (block 1018) to form the conductive channel core having a higher step level than the blocking region (e.g., forming the conductive channel core as a mesa compared to the blocking region). The process 1000 can also include growing a second portion of the first mirror region having a plurality of non-planarized second mirror layers having one or more indices of refraction (block 1020), wherein the non-planarized second mirror layers have a connected or disconnected step. Then (optionally) growing a first spacer region over the first mirror region (block 1022). Then an active region is grown over the first spacer region (block 1024) (or over the first mirror when the first spacer region is not grown). Then a conducting region is grown over the active region (block 1026). Then, a second mirror region is grown with or without forming the blocking region and conductive channel in the second mirror region (block 1028).

Figure 11:
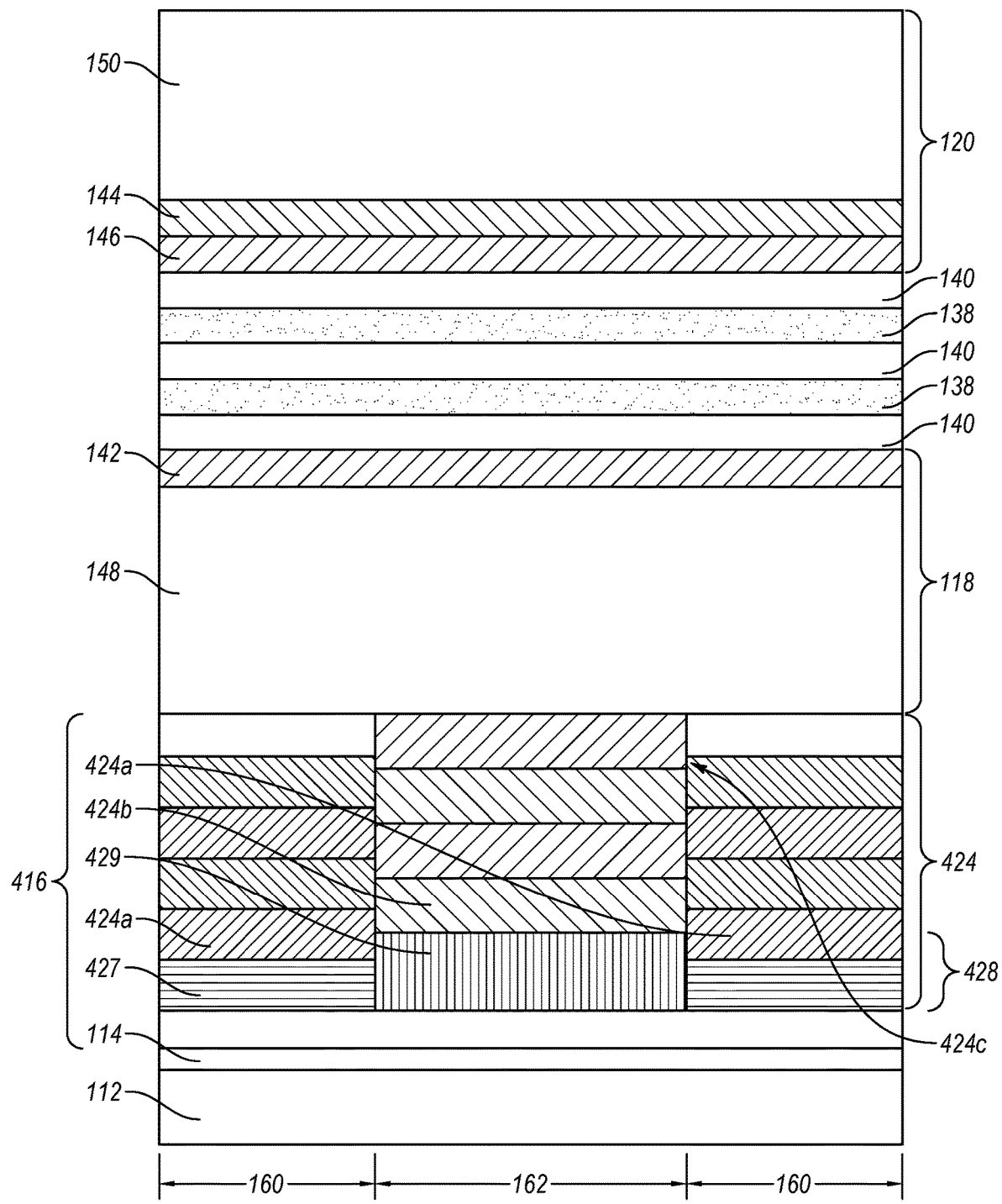
FIG. 11 is a schematic of an embodiment of a VCSEL layered semiconductor operating environment having the bottom mirror layers of the outer current blocking region disconnected with the corresponding bottom mirror layers of the central mode confinement region.

FIG. 11 illustrates the active region 122 and confining layers 118 and 120 over isolation region 428 having the blocking region 427 and central conducting channel core 429. A substrate 114 is formed on a bottom contact 112 and is doped with a first type of impurities (i.e., p-type or n-type dopant). A bottom mirror stack 416, or a portion thereof, is formed on substrate 114. The isolation region 428 is formed on or in the bottom mirror stack 416 or portion thereof. The blocking region 427 forms the outer current blocking regions 160, and the central conducting channel core 429 forms the central mode confinement region 162.

Active region 122 is formed from one or more quantum wells 138 that are separated by quantum well barriers 140. The confining layers 118 and 120 may optionally include high aluminum content regions 142 and 144, respectively. The high aluminum content regions provide good carrier confinement in active region 122.

Confining region 120 can include a ramp region 146 that is positioned between active region 122 and high aluminum content region 144. As discussed, the combination of high aluminum content region 144 and the ramp region 146 provides an injection structure with good carrier confinement and good electron injection.

Depending on the design of the VCSEL device and the thickness of high aluminum content regions 142 and 144, the confining regions 118 and 120 can optionally include spacer layers 148 and 150, respectively. The thickness of spacer layers 148 and 150 can be dependent upon the kind of VCSEL device being fabricated. In a vertical cavity resonant device such as a VCSEL, the spacer layers provide resonant spacing between mirrors and provide that the quantum wells of the active region are centered on a peak of the optical field if desired.

The bottom mirror stack 416 can include alternating mirror period layers that are stepped, where each layer is stepped and connected. Each mirror period layer includes a lateral lower step 424a and a central upper step 424b that are connected by a step connection 424c. Mirrors have alternating layers. Here, each layer has a lateral lower step 424a and a central upper step 424b that are connected by a step connection 424c.

Similarly, the isolation region shown in FIG. 2C can be included in the bottom mirror as per FIG. 11. Additionally, the laser can include an isolation region in the top (top isolation region) and an isolation region in the bottom (bottom isolation region), which can be obtained by combining the embodiments shown in the different figures.

In one embodiment, the processing can include fabrication of the semiconductor to grow the semiconductor layers in a reactor. Then, the semiconductor is taken out of the reactor and the blocking region is implanted and etched as described herein. After implanting and etching, the implanted semiconductor is placed into the reactor for further growth of the semiconductor, which results in the non-planarized semiconductor layers above the implanted and etched blocking region and conductive channel. The second semiconductor growth over the implanted and etched blocking region and conductive channel can be considered to be regrowth. This regrowth can be performed whether the isolation region having the implanted and etched blocking region and conductive channel is under or over the active region. For example, when the isolation region is over the substrate and under the active region, the regrowth can be performed to form the lower non-planarized semiconductor layers, such as the non-planarized bottom mirror. In another example, when the isolation region is over the active region, the regrowth can be performed to form the upper non-planarized semiconductor layers, such as the non-planarized top mirror. Additionally, such manufacturing can be performed to have non-planarized semiconductor layers over both the bottom isolation region and the top isolation region.

In one embodiment, whether the non-planarized semiconductor layers are over a bottom isolation region and/or over a top isolation region, a planarizing layer can be prepared to flatten out the structure for later planarized layers, if present. The non-planarized semiconductor layers may have a planarizing layer placed thereover, or the top region of the non-planarized layer can be selectively etched to become planar or selectively grown so as to become planarized (e.g., using masks or photoresist over the layer that is not grown for the planarization).

In one embodiment, the semiconductors, including the active region and others, can be non-planarized when grown over a non-planarized region. As such, the non-planarized regions shown in the figures may be continued in all semiconductor layers formed over the non-planarized region. For example, when the isolation region is under the active region, all regions over the isolation region, including the active region, may be non-planarized.

In one embodiment, the blocking region can be in the middle surrounded by the conductive channel, which would be annular around the blocking region. As such, the orientation of the blocking region and conductive channel shown in FIG. 2A and FIG. 2B can be reversed.

In one embodiment, the lack of trenches and oxidation can result in the conductive cores (or central blocking region) being closer together than prior devices. Prior devices, due to trenches and oxidation, can have the cores (conductive or blocking) at about 21 to 25 microns apart, in an example. However, because the current device omits the trenches and oxidation, the cores (conductive or blocking) can be much closer together, such as 4 microns, or from 2-6 microns, or from 1-8 microns apart (center to center).

Now, with the cores center to center at about 4 microns, for example, high density arrays can be achieved. The high density can allow for coherent arrays with cores with the same phase. Also, there can be some control of coherence of beams in a phased array, which can focus down to a small spot for use in scanning. Additionally, more precise control of the high density array allows for laser weaponry to use the high density arrays achieved with the present technology.

The technology can allow coherent arrays, which means that all of the cores have the same phase or that you can control the phase between the cores, which can provide a laser beam that can be pointed to a desired location without physically turning the laser. In an example, in a fighter plane there is a phased array in the nose that illuminates another fighter plane, and thereby the phased array can point anywhere. Control of the coherence of the beam of a phased array can allow for focus of the beam down to a small spot. Such control allows for the invention to be used in scanning applications. The control may also be useful in a laser weapon because the arrangement can distribute many of the cores over a large area, which can control the heat dissipation, and control of the phase of all of the cores can allow them to be combined, such as by focusing, so that all of the cores work together to combine their power to get a very large amount of power per unit area when focused.

Typically, lasers include the P regions in the upper portion of the laser and the N regions in the lower portion of the laser, relative to the active region. However, there can be advantages with the N region being in the upper portion and the P region being in the lower portion, relative to the active region. As such, the devices described herein can be configured with either of these orientations. The lower region is grown on the substrate before the upper region is grown over the lower region.

In one embodiment, a non-planarized VCSEL can include: an active region; a blocking region over the active region, the blocking region having a first thickness; one or more conductive channel cores in the blocking region, the one or more conductive channel cores having a second thickness that is larger than the first thickness, wherein the blocking region is defined by having an implant and the one or more conductive channel cores are devoid of the implant, wherein the blocking region is lateral the one or more conductive channel cores, the blocking region and one or more conductive channel cores being an isolation region; and a non-planarized semiconductor region of one or more non-planarized semiconductor layers over the isolation region.

In one embodiment, a non-planarized VCSEL can include: a blocking region over or under the active region, the blocking region having a first thickness; one or more conductive channel cores in the blocking region, the one or more conductive channel cores having a second thickness that is larger than the first thickness, wherein the blocking region is defined by having an implant and the one or more conductive channel cores are devoid of the implant, wherein the blocking region is lateral the one or more conductive channel cores, the blocking region and one or more conductive channel cores being an isolation region; and a non-planarized semiconductor region of one or more non-planarized semiconductor layers over the isolation region.

In one embodiment, a non-planarized VCSEL can include: a blocking region, the blocking region having a first thickness; one or more conductive channel cores in the blocking region, the one or more conductive channel cores having a second thickness that is larger than the first thickness, wherein the blocking region is defined by having an implant and the one or more conductive channel cores are devoid of the implant, wherein the blocking region is lateral the one or more conductive channel cores, the blocking region and one or more conductive channel cores being an isolation region; and a non-planarized semiconductor region of one or more non-planarized semiconductor layers over the isolation region.

Accordingly, the non-planarized VCSELs can have various configurations. In one aspect, the VCSEL can include a planarized bottom mirror region below the active region and a non-planarized top mirror region above the isolation region. In one aspect, the VCSEL can include a non-planarized bottom mirror region below the active region and a non-planarized top mirror region above the isolation region. In one aspect, the VCSEL can include a non-planarized bottom mirror region below the active region and a planarized top mirror region above the isolation region. In one aspect, the VCSEL can include a bottom spacer region between the bottom mirror region and the active region and/or a top spacing region between the active region and the isolation region. In one aspect, the VCSEL can include a conductive channel core that extends through the blocking region and contacts the active region. In one aspect, the conductive channel core extends through the blocking region and contacts the top spacer region. In one aspect, the blocking region has a thickness from 1 nm to 500 nm, from 1 nm to 30 nm, from 1 nm to 10 nm, or from 1 nm to 3 nm. In one aspect, the conductive channel core has a thickness from 1 nm to 1000 nm, from 1 nm to 60 nm, from 1 nm to 20 nm, or from 1 nm to 6 nm. In one aspect, the conductive channel core has a diameter of about 1 micron to about 10 microns, or up to about 200 microns (e.g., for a large high power device). In one aspect, the conductive channel core has a diameter of about 2 microns to about 6 microns.

In one embodiment, the VCSEL can include one conductive channel core or a plurality of the conductive channel cores in a common blocking region. In one aspect, the VCSEL can include a single conductive channel core. In one aspect, the VCSEL can include a single conductive channel core in a single blocking region. In one aspect, the VCSEL can include five of the conductive channel cores in a common blocking region. In one aspect, an array of the VCSELs can include a plurality of the VCSELs.

In one embodiment, the conductive channel core has a higher refractive index than the blocking region. In one aspect, the blocking region has a lower refractive index than the conductive channel core. In one aspect, the conductive channel core has a refractive index from about 3.7 to 3. In one aspect, the blocking region has a refractive index from about 3.7 to 3. In one aspect, the difference in conductive channel core refractive index and blocking region index can be about 0.1, 0.2, 0.5, 0.7, or any range therebetween between any of the values.

In one embodiment, the VCSEL can be devoid of features common in VCSELs. In one aspect, the VCSEL can be devoid of an oxide aperture. In one aspect, the VCSEL can be devoid of oxidation. In one aspect, the VCSEL can be devoid of a mesa having the isolation region therein.

In one embodiment, the blocking region can have an implant of various types. In one aspect, the implant is silicon. In one aspect, the implant is oxygen. In one aspect, the blocking layer includes a base material of the conductive channel core with the addition of the implant. In one aspect, the conductive channel core is AlGaAs.

In one embodiment, the mirror layers in the non-planarized top mirror have a connected step such that a first non-planarized top mirror layer has a lower region above the blocking region that is connected to a higher region above the conductive channel core.

In one embodiment, the VCSEL can include the mirror layers in the non-planarized top mirror and have a disconnected step such that a first non-planarized top mirror layer has a lower region above the blocking region that is disconnected to a higher region above the conductive channel core.

In one embodiment, a method of making the VCSEL can include: forming the VCSEL having the active region; forming the isolation region over the active region, the isolation region having the blocking region with the conductive channel cores; and forming the non-planarized semiconductor region of one or more semiconductor layers over the isolation region.

In one embodiment, a method of making the VCSEL can include: forming the VCSEL having the active region; forming the isolation region under the active region, the isolation region having the blocking region with the conductive channel cores; and forming the non-planarized semiconductor region of one or more semiconductor layers over the isolation region.

In one embodiment, a method of making the VCSEL can include: forming the VCSEL having the isolation region having the blocking region with the conductive channel cores; and forming the non-planarized semiconductor region of one or more semiconductor layers over the isolation region.

In one aspect, the method can include forming the blocking region and one or more conductive channel cores from a conductive layer by implanting a region of the conductive layer that becomes the blocking region and where one or more regions devoid of the implanting becomes the one or more conductive channel cores. In one aspect, the method can include forming the blocking region and etching the blocking region to have the first thickness that is smaller than the second thickness of the one or more conductive channel cores. In one aspect, the method can include coating one or more regions of the top of the conductive layer with a photoresist that inhibits implantation and etching where the one or more regions with the photoresist define the one or more conductive channel cores and the region without the photoresist defines the blocking region. The method can also include implanting the region without the photoresist to form the blocking region. In one aspect, the method can include coating one or more regions of the top of the conductive layer with a photoresist that inhibits implantation and etching where the one or more regions with the photoresist define the one or more conductive channel cores and the region without the photoresist defines the blocking region; implanting the region without the photoresist to form the blocking region; and etching the blocking region partially so as to leave a thinner blocking region.

In one aspect, the method can include removing the photoresist after the etching of the blocking region. In one aspect, the method can include removing the photoresist after the etching of the blocking region and forming the non-planarized top mirror region after removing the photoresist, wherein the amount of etching of the blocking region defines an offset of upper mirror layers and lower mirror layers of the non-planarized top mirror region. In one aspect, the method can include removing the photoresist after the etching of the blocking region and forming the non-planarized semiconductor region after removing the photoresist, wherein the amount of etching of the blocking region defines an offset of the layers of the non-planarized semiconductor region.

In one embodiment, the method can include forming the planarized bottom mirror region below the active region and forming the non-planarized top mirror region above the isolation region. In one aspect, the method can include forming the non-planarized bottom mirror region below the active region and forming the non-planarized top mirror region above the isolation region. In one aspect, the method can include forming the non-planarized bottom mirror region below the active region and forming the planarized top mirror region above the isolation region. In one aspect, the method can include forming the bottom spacer region between the bottom mirror region and active region and forming the top spacer region between the active region and blocking region.

In one aspect, the method can include forming the conductive channel core and the blocking region so that both contact the active region. In one aspect, the method can include forming the conductive channel core and the blocking region so that both contact the top spacer region. In one aspect, the method can include forming the isolation region to have a plurality of the conductive channel cores in the blocking region. In one aspect, the method can include forming the conductive channel core to have the higher refractive index than the blocking region. In one aspect, the method can include forming the blocking region to have a lower refractive index than the conductive channel core.

In one aspect, the method can include using MOCVD to form the isolation region. In one aspect, the method can include using MOCVD to form the isolation region and non-planarized top mirror region. In one aspect, the method can include using MOCVD, implantation and etching to form the blocking region around the one or more conductive channel cores.

In one aspect, the method can be devoid of planarizing the top mirror region.

In one aspect, the method can include forming an array of the VCSELs.

In one aspect, the method can include forming the VCSEL to be devoid of an oxide aperture. In one aspect, the method can include forming the VCSEL to be devoid of oxidation. In one aspect, the method can include forming the VCSEL to be devoid of a mesa having the isolation region.

In one embodiment, after forming a semiconductor region, the method can include removing the semiconductor region from a reactor, performing the implantation and etching of the semiconductor region, then placing the implanted and etched semiconductor region into the reactor, and forming non-planarized semiconductor layers over the implanted and etched semiconductor region.

In one embodiment, a non-planarized VCSEL can include: an active region; a blocking region under the active region and over a substrate, the blocking region having a first thickness; and one or more conductive channel cores in the blocking region, the one or more conductive channel cores having a second thickness that is larger than the first thickness. In one aspect, the blocking region is defined by having an implant and the one or more conductive channel cores are devoid of the implant, wherein the blocking region is lateral the one or more conductive channel cores, the blocking region and one or more conductive channel cores being an isolation region. The VCSEL may also include a non-planarized semiconductor region of one or more non-planarized semiconductor layers over the isolation region.

In one aspect, the VCSEL can include a planarized top mirror region above the active region and a non-planarized bottom mirror region below the active region and above or including the isolation region. In one aspect, the VCSEL can include a non-planarized bottom mirror region below the active region and a non-planarized top mirror region above the isolation region. In one aspect, the VCSEL can include a non-planarized bottom mirror region below the active region and a planarized top mirror region above the isolation region.

In one aspect, the VCSEL can include a top spacer region between the top mirror region and active region and/or a bottom spacing region between the active region and bottom isolation region.

In one aspect, the conductive channel core extends through the blocking region and contacts the substrate. In one aspect, the conductive channel core extends through the blocking region and contacts a portion of the bottom mirror on the substrate. In one aspect, the blocking region has a thickness from 1 nm to 500 nm, from 1 nm to 30 nm, from 1 nm to 10 nm, or from 1 nm to 3 nm. In one aspect, the conductive channel core has a thickness from 1 nm to 1000 nm, from 1 nm to 60 nm, from 1 nm to 20 nm, or from 1 nm to 6 nm. In one aspect, the conductive channel core has a diameter of about 1 micron to about 10 microns, or up to about 200 microns (e.g., for a large high power device). In one aspect, the conductive channel core has a diameter of about 2 microns to about 6 microns. In one aspect, the VCSEL can include a plurality of the conductive channel cores in a common blocking region. In one aspect, the VCSEL can include a single conductive channel core. In one aspect, the VCSEL can include a single conductive channel core in a single blocking region. In one aspect, the VCSEL can include a single conductive channel core in the device.

In one embodiment, a non-planarized VCSEL can include: an active region; one or more blocking cores over the active region, the blocking core having a first thickness; one or more conductive channel perimeters around the blocking core, the one or more conductive channel perimeters having a second thickness that is larger than the first thickness, wherein the blocking core is defined by having an implant and the one or more conductive channel perimeters are devoid of the implant, wherein the conductive channel perimeters are lateral the one or more blocking cores, the conductive channel perimeters and the one or more blocking cores being an isolation region; and a non-planarized semiconductor region of one or more non-planarized semiconductor layers over the isolation region.

In one embodiment, a non-planarized VCSEL can include: an active region; one or more blocking cores under the active region and over a substrate, the blocking core having a first thickness; one or more conductive channel perimeters around the blocking core, the one or more conductive channel perimeters having a second thickness that is larger than the first thickness, wherein the blocking core is defined by having an implant and the one or more conductive channel perimeters are devoid of the implant, wherein the conductive channel perimeters are lateral the one or more blocking cores, the conductive channel perimeters and the one or more blocking cores being an isolation region; and a non-planarized semiconductor region of one or more non-planarized semiconductor layers over the isolation region.

In one embodiment, an array of VCSELs can include a plurality of VCSELs arranged in an ordered pattern, wherein the plurality of VCSELs includes a plurality of different types of VCSELs, each different type of VCSEL having a different characteristic. In one aspect, the different characteristic of each different type of VCSEL has a difference in one or more of: optical aperture dimension, optical aperture shape, optical aperture orientation, or divergence angle. In one aspect, the plurality of VCSELs includes a sub-array of emitters, the sub-array having at least two different types of VCSELs having different characteristics. In one aspect, the plurality of VCSELs includes a sub-array of 3, 4, 5, 6, or other integer of emitters, the sub-array having at least two different types of VCSELs having different characteristics. In one aspect, the plurality of VCSELs includes a plurality of unique sub-arrays. In one aspect, the plurality of VCSELs includes a sub-array of emitters arranged in a polygonal shape, the sub-array having at least two different types of VCSELs having different characteristics. In one aspect, the plurality of VCSELs includes a sub-array of 3, 4, 5, or 6 or more emitters, the sub-array having at least two different types of VCSELs having different characteristics, wherein the sub-array of 3 emitters is in a shape of a triangle, the sub-array of 4 emitters is in a shape of a square, the sub-array of 5 emitters is in a shape of a pentagon, or the sub-array of 6 emitters is in a shape of a hexagon. In one aspect, the plurality of VCSELs includes a sub-array in a polygon shape, each corner of the polygon shape has one or more individual emitters. In one aspect, the plurality of VCSELs includes a sub-array in a polygon shape, each corner of the polygon shape has one or more individual emitters arranged in a sub-pattern. In one aspect, the plurality of VCSELs includes a sub-array of adjacent emitters that includes at least two different types of emitters. In one aspect, the different characteristic of each different type of VCSEL has a difference in optical aperture dimension. In one aspect, the different characteristic of each different type of VCSEL has a difference in optical aperture shape. In one aspect, the different characteristic of each different type of VCSEL has a difference in relative optical aperture orientation angle between emitters. In one aspect, the different characteristic of each different type of VCSEL has a difference in divergence angle. In one aspect, the array is devoid of a random distribution of VCSEL emitters. In one aspect, the VCSEL array can include one or more inoperable emitters, which may be temporarily inoperable or permanently inoperable; however, the VCSEL emitter is present in the regular pattern (not random).

In one embodiment, a method of emitting light includes emitting light from a plurality of VCSELs in the VCSEL array that has the regular pattern of VCSELs. Such a method can include randomly turning on some emitters and turning of other emitters, or such turning on or off may be programmed such that it appears that random emitters in the VCSEL array are emitting light where other emitters are not emitting light.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is also to be understood that the terminology used herein is for the purpose of describing particular embodiments only, and is not intended to be limiting.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

All references recited herein are incorporated herein by specific reference in their entirety.

The invention claimed is:

1. A vertical cavity surface emitting laser (VCSEL) comprising:
   an active region;
   a blocking layer comprising a first material having an implant material, the blocking layer having at least one implant devoid region formed therein extending from a bottom blocking layer surface to a top blocking layer surface, the blocking layer having a first thickness;
   each of the at least one implant devoid regions forming a conductive channel in the blocking layer so that the implant material defines a boundary between the blocking layer and each conductive channel that has the first material devoid of the implant material, each conductive channel having:
      a bottom conductive channel surface that is continuous with the bottom blocking layer surface,
      a top conductive channel surface that is discontinuous with the top blocking layer surface;
      a second thickness that is thicker than the first thickness;
      a side conductive channel boundary extending from the bottom blocking layer surface to the top blocking layer surface; and
      a side conductive channel surface extending from the top blocking layer surface to the top conductive layer surface;
   a first non-planarized semiconductor layer over and in contact with the:
      top blocking layer surface,
      each top conductive channel surface; and
      each side conductive channel surface.

2. The VCSEL of claim 1, wherein the blocking layer and each conductive channel are under the active region, the VCSEL further comprising a plurality of non-planarized semiconductor layers over the first non-planarized semiconductor layer forming a non-planarized semiconductor region with the first non-planarized semiconductor layer.

3. The VCSEL of claim 2, further comprising a planarized semiconductor layer over the non-planar semiconductor region and under the active region, the planarized semiconductor layer having a planar bottom surface and a planar top surface.

4. The VCSEL of claim 2, wherein the non-planarized semiconductor region is a mirror period region.

5. The VCSEL of claim 1, wherein the blocking layer and at least one conductive channel are over the active region, the VCSEL further comprising a plurality of non-planarized semiconductor layers over the first non-planarized semiconductor layer forming a non-planarized semiconductor region with the first non-planarized semiconductor layer.

6. The VCSEL of claim 5, further comprising a planarized semiconductor layer over the non-planar semiconductor region and having a planar bottom surface and a planar top surface.

7. The VCSEL of claim 5, wherein the non-planarized semiconductor region is a mirror period region.

8. The VCSEL of claim 1, further comprising a plurality of the conductive channels laterally arranged with respect to each other in the blocking layer.

9. The VCSEL of claim 1, wherein the VCSEL is:
   devoid of an oxide aperture;
   devoid of oxidation; or
   devoid of a mesa having the blocking layer and at least one conductive channel.

10. The VCSEL of claim 1, wherein the implant material is silicon or oxygen.

11. The VCSEL of claim 1, wherein the first non-planarized semiconductor layer has a connected step such that a lower step on the blocking layer is connected to an upper step above each conductive channel wherein the first non-planarized semiconductor layer has a same material in the lower step and upper step.

12. The VCSEL of claim 1, wherein the first non-planarized semiconductor layer has a disconnected step such that a lower step on the blocking layer is disconnected to an upper step above each conductive channel, wherein the first non-planarized semiconductor layer has a same material in the lower step and upper step.

13. A vertical cavity surface emitting laser (VCSEL) array comprising:
   the VCSEL of claim 1 with a plurality of the conductive channels laterally arranged in a single blocking layer, the plurality of conductive channels being arranged in a pattern.

14. The VCSEL array of claim 13, wherein the different characteristic is at least one of: different cross-sectional shape; different orientation; different dimension, or divergence angles.

15. The VCSEL array of claim 13, wherein the pattern is a uniform arrangement of the conductive channels.

16. The VCSEL array of claim 13, wherein the pattern is a non-uniform arrangement of the conductive channels.

17. The VCSEL array of claim 13, wherein the pattern is defined by a plurality of sub-patterns of the conductive channels.

18. A method of making the VCSEL of claim 13, comprising:
   forming the layer of the first material;
   forming a plurality of resistive layers on the first material to define a cross-sectional profile of a plurality of implant devoid regions;
   implanting an implant material into the first material around the plurality of resistive layers to form the blocking layer and define the boundary between the blocking layer and each conductive channel;
   etching the blocking layer around the plurality of resistive layers to form the top blocking layer surface and each side conductive channel surface;
   removing the plurality of resistive layers to form each top conductive channel surface; and forming the first non-planarized semiconductor layer over the top blocking layer surface, each top conductive channel surface, and each side conductive channel surface.

19. The VCSEL array of claim 13, wherein the plurality of conductive channels includes a plurality of different types of conductive channels, each different type of conducive channel having a different characteristic.

20. A method of making the VCSEL of claim 1, comprising:

forming the layer of the first material;

forming at least one resistive layer on the first material to define a cross-sectional profile of the at least one implant devoid region;

implanting an implant material into the first material around the at least one resistive layer to form the blocking layer and define the boundary between the blocking layer and each conductive channel;

etching the blocking layer around the at least one resistive layer to form the top blocking layer surface and each side conductive channel surface;

removing the at least one resistive layer to form each top conductive channel surface; and forming the first non-planarized semiconductor layer over the top blocking layer surface, each top conductive channel surface, and each side conductive channel surface.

* * * * *